United States Patent
Nakamura et al.

(10) Patent No.: US 12,315,696 B2
(45) Date of Patent: May 27, 2025

(54) DEVICE FOR OBSERVING PERMEATION AND DIFFUSION PATH OF OBSERVATION TARGET GAS, OBSERVATION TARGET GAS MEASURING METHOD, POINT-DEFECT LOCATION DETECTING DEVICE, POINT-DEFECT LOCATION DETECTING METHOD, AND OBSERVATION SAMPLES

(71) Applicant: NATIONAL INSTITUTE FOR MATERIALS SCIENCE, Tsukuba (JP)

(72) Inventors: Akiko Nakamura, Tsukuba (JP); Yoshiharu Murase, Tsukuba (JP); Hideaki Nishikawa, Tsukuba (JP); Taro Yakabe, Tsukuba (JP); Naoya Miyauchi, Tsukuba (JP)

(73) Assignee: NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 399 days.

(21) Appl. No.: 17/908,744

(22) PCT Filed: Feb. 25, 2021

(86) PCT No.: PCT/JP2021/007011
§ 371 (c)(1),
(2) Date: Sep. 1, 2022

(87) PCT Pub. No.: WO2021/177125
PCT Pub. Date: Sep. 10, 2021

(65) Prior Publication Data
US 2023/0127466 A1    Apr. 27, 2023

(30) Foreign Application Priority Data

Mar. 2, 2020 (JP) .................................. 2020-034719
May 27, 2020 (JP) .................................. 2020-092742

(51) Int. Cl.
H01J 37/20 (2006.01)
H01J 37/244 (2006.01)
(Continued)

(52) U.S. Cl.
CPC ............ *H01J 37/20* (2013.01); *H01J 37/244* (2013.01); *H01J 37/263* (2013.01);
(Continued)

(58) Field of Classification Search
CPC ........ H01J 37/20; H01J 37/244; H01J 37/263; H01J 37/265; H01J 37/28; H01J 2237/006;
(Continued)

(56) References Cited

U.S. PATENT DOCUMENTS 2,288,766 A * 7/1942 Wolff ...................... H04N 5/33
313/523
4,076,420 A * 2/1978 De Maeyer .......... G01N 21/272
356/73
(Continued)

FOREIGN PATENT DOCUMENTS

JP    2003-308801 A    10/2003
JP    2017-18457 A    1/2017
(Continued)

OTHER PUBLICATIONS

Takai, "Importance of analytical techniques and new developments for overcoming hydrogen embrittlement in metallic materials", SCAS News 2009-II, 2009, vol. 30, pp. 3-6, cited in Specification, w/English machine translation (15 pages).
(Continued)

*Primary Examiner* — David A Vanore
(74) *Attorney, Agent, or Firm* — WHDA, LLP

(57) ABSTRACT

The device for observing permeation and diffusion path of observation target gas includes: a scanning electron micro-
(Continued)

scope 15; an observation target ion detecting unit 20; an observation target gas supply unit 19; a diaphragm-type sample holder 12, to which the sample is mounted in attachable/detachable state, as a diaphragm dividing between the analysis chamber 11 and the observation target gas pipe 14; and a control unit 50. The control unit acquires a SEM image and at the same time detects the observation target gas, which diffuses within the sample and is discharged to the surface of the sample, by electron stimulated desorption, in a state where stress is applied to the sample due to differential pressure generated between the analysis chamber and the observation target gas pipe by supplying the observation target gas, and obtains an ESD image of the observation target ions.

15 Claims, 21 Drawing Sheets

(51) Int. Cl.
  *H01J 37/26* (2006.01)
  *H01J 37/28* (2006.01)
(52) U.S. Cl.
  CPC ............ *H01J 37/265* (2013.01); *H01J 37/28* (2013.01); *H01J 2237/006* (2013.01); *H01J 2237/2062* (2013.01); *H01J 2237/2448* (2013.01); *H01J 2237/24585* (2013.01); *H01J 2237/2809* (2013.01)
(58) Field of Classification Search
  CPC ....... H01J 2237/2062; H01J 2237/2448; H01J 2237/24585; H01J 2237/2809; H01J 2237/2803; H01J 2237/2857; G01N 23/2204; G01N 23/2208; G01N 23/2251
  See application file for complete search history.

(56) References Cited

U.S. PATENT DOCUMENTS

| | | | | |
|---|---|---|---|---|
| 4,823,006 | A * | 4/1989 | Danilatos | H01J 37/244 |
| | | | | 250/441.11 |
| 6,376,042 | B1 * | 4/2002 | Peiffer | B29C 55/023 |
| | | | | 428/458 |
| 9,620,331 | B1 * | 4/2017 | Bhattiprolu | H01J 37/261 |
| 9,905,394 | B1 * | 2/2018 | Bhattiprolu | H01J 37/265 |
| 10,989,724 | B1 * | 4/2021 | Holmes | G01N 35/10 |
| 11,112,418 | B1 * | 9/2021 | Holmes | G01N 15/1434 |
| 12,094,684 | B1 * | 9/2024 | Own | H01J 37/28 |
| 2005/0173632 | A1 * | 8/2005 | Behar | B01L 3/508 |
| | | | | 250/311 |
| 2011/0147581 | A1 * | 6/2011 | Chen | H01J 49/429 |
| | | | | 250/288 |
| 2012/0235036 | A1 * | 9/2012 | Hatakeyama | H01J 37/20 |
| | | | | 250/310 |
| 2012/0287257 | A1 * | 11/2012 | Chino | H01J 37/265 |
| | | | | 348/E5.022 |
| 2013/0078624 | A1 * | 3/2013 | Holmes | G01N 35/00 |
| | | | | 73/61.52 |
| 2013/0213945 | A1 * | 8/2013 | Stegmann | G01N 23/04 |
| | | | | 219/121.83 |
| 2014/0291508 | A1 * | 10/2014 | Uemoto | G01N 23/2255 |
| | | | | 250/306 |
| 2014/0296089 | A1 * | 10/2014 | Holmes | C12Q 1/6883 |
| | | | | 435/7.1 |
| 2014/0308661 | A1 * | 10/2014 | Holmes | G01N 35/0092 |
| | | | | 435/6.1 |
| 2015/0213999 | A1 * | 7/2015 | Ominami | H01J 37/28 |
| | | | | 250/310 |
| 2015/0221470 | A1 * | 8/2015 | Ominami | H01J 37/16 |
| | | | | 250/441.11 |
| 2015/0228448 | A1 * | 8/2015 | Ominami | H01J 37/228 |
| | | | | 250/441.11 |
| 2015/0228449 | A1 * | 8/2015 | Kawanishi | H01J 37/18 |
| | | | | 250/307 |
| 2015/0235803 | A1 * | 8/2015 | Ominami | H01J 37/261 |
| | | | | 250/307 |
| 2015/0311033 | A1 * | 10/2015 | Ominami | H01J 37/224 |
| | | | | 250/306 |
| 2016/0054343 | A1 * | 2/2016 | Holmes | G01N 35/026 |
| | | | | 422/65 |
| 2016/0071685 | A1 * | 3/2016 | Kawanishi | H01J 37/20 |
| | | | | 250/396 R |
| 2016/0203941 | A1 * | 7/2016 | Kawanishi | G01M 3/02 |
| | | | | 250/398 |
| 2016/0343539 | A1 * | 11/2016 | Hariyama | H01J 37/20 |
| 2020/0013580 | A1 * | 1/2020 | Henstra | H01J 37/244 |
| 2023/0127466 | A1 * | 4/2023 | Nakamura | G01N 23/2251 |
| | | | | 250/307 |
| 2023/0221268 | A1 * | 7/2023 | Nakamura | G01N 23/2204 |
| | | | | 250/307 |
| 2024/0170248 | A1 * | 5/2024 | Podhola | H01J 31/50 |
| 2024/0212966 | A1 * | 6/2024 | Igari | H01J 37/073 |
| 2024/0355574 | A1 * | 10/2024 | Nagahara | H01J 37/09 |

FOREIGN PATENT DOCUMENTS

| | | |
|---|---|---|
| JP | 2019-74468 A | 5/2019 |
| JP | 2019-110055 A | 7/2019 |
| JP | 2019-145255 A | 8/2019 |

OTHER PUBLICATIONS

Takai, "Common Bases and Recent Progress on Hydrogen Embrittlement Studies of Steels," Sanyo Technical Report, 2015, vol. 22, No. 1, pp. 14-20, cited in Specification, w/English machine translation (22 pages).
Takura et al., "Effect of Surface Processing on Hydrogen Desorption from Stainless Steel to UHV", Journal of The Vacuum Society of Japan, 2014, vol. 57, No. 1, pp. 23-26, cited in Specification and ISR, w/English machine translation (14 pages).
Miyauchi et al., "Electron Stimulated Desorption Measurement of Permeated Hydrogen through Stainless Steel Membrane", Journal of The Vacuum Society of Japan, 2015, vol. 58, No. 10, pp. 387-391, cited in Specification and ISR, w/English machine translation (16 pages).
International Search Report dated Jun. 8, 2021, issued in counterpart International Application No. PCT/JP2021/007011 (3 pages).

\* cited by examiner

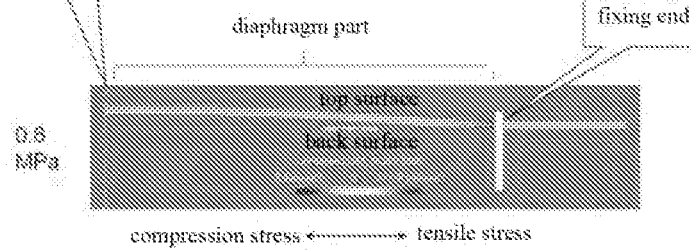
FIG. 11A(a)
FIG. 11A(b)
FIG. 11A(c)
FIG. 11B(a)
FIG. 11B(b)
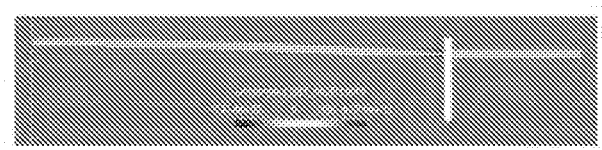 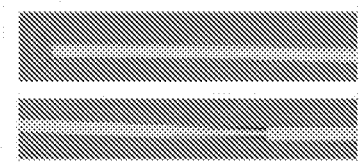
FIG. 11B(c)
FIG. 11C(a)
FIG. 11C(b)
 
FIG. 11C(c)
FIG. 11D(a)
FIG. 11D(b)
 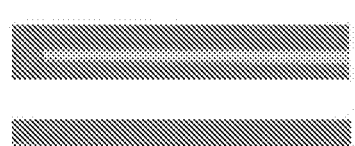
FIG. 11D(c)

DEVICE FOR OBSERVING PERMEATION AND DIFFUSION PATH OF OBSERVATION TARGET GAS, OBSERVATION TARGET GAS MEASURING METHOD, POINT-DEFECT LOCATION DETECTING DEVICE, POINT-DEFECT LOCATION DETECTING METHOD, AND OBSERVATION SAMPLES

TECHNICAL FIELD

The present invention relates to a device for observing permeation and diffusion path of observation target gas capable of exciting observation target gas such as hydrogen desorbed from a sample by using scanning electrons of an electron microscope and imaging an existence region, on the surface of a solid, of observation target gas having been detached from the surface of the solid, an observation method, a point-defect location detecting device and a point-defect location detecting method using those, and observation samples used for those.

BACKGROUND ART

The hydrogen embrittlement in structural materials is a major challenge that will become increasingly serious with the progress of the use of hydrogen in society. Since hydrogen has only one electron, it cannot be detected by electron spectroscopy or energy dispersion X-ray spectroscopy (EDX). That is why the vibrational spectroscopy of hydrogen and other atoms, the measurement based on nuclear reaction method, the hydrogen microprinting method (such as Ag decoration method), etc. have been used to indirectly check the presence of hydrogen.

As methods of observing distribution of hydrogen discharged to the surface of a solid, the nuclear reaction method, the microprinting method (Ag decoration), etc. are available, but none of those can dynamically trace hydrogen diffusing within the solid.

A hydrogen permeation position detecting device excites, detaches, and images hydrogen discharged from a sample with scanning electrons of an electron microscope. It is a type of operando hydrogen microscopes (see Patent Literatures 1 and 2). The operando hydrogen microscope makes hydrogen permeate a material, and obtains a two-dimensional image of the released hydrogen. With the conventional method of visualizing permeated hydrogen using operando hydrogen microscope, a sample to be observed is fixed at the position of the partition wall of the vacuum vessel, and by exposing the low vacuum side of the sample to the hydrogen gas having appropriate partial pressure, hydrogen having diffused within the solid is observed on the high vacuum side as discharged hydrogen.

The hydrogen embrittlement is said to occur due to the absorption of hydrogen caused by corrosion, welding, pickling, electroplating, etc. This fracture due to hydrogen absorption is called "delayed fracture". The brittle fracture due to hydrogen is said to occur at grain boundaries and areas where the tensile stress is applied and the stress is concentrated. Studies on hydrogen embrittlement have long been conducted, and many studies are still being conducted. Many of the researches on hydrogen materials and hydrogen embrittlement intend to study the behavior of hydrogen in a state where a structural material is distorted or stress is applied to the material. However, since there are many factors that cause the embrittlement such as materials, structures, the stress, and the environment, and they are complicatedly related to one another, it is difficult to separate those influential factors from one another. The true nature of the phenomenon still remains unrevealed (Non-Patent Literatures 1 and 2).

Electron Stimulated Desorption (hereinafter called as ESD method), which is a known process in the field of surface analysis, analyzes a surface by ionizing adsorbed electrons by electron irradiation for desorption. ESD makes it possible to directly observe hydrogen in the real time (Non-Patent Literatures 3 and 4).

Meanwhile, although it is possible by using ESD method to visualize positional information of hydrogen existing on the surface, the measurement cannot be continued if hydrogen has been totally desorbed. Therefore, ESD method is unsuitable for the measurement of amounts of discharged hydrogen existing as trace in the steel.

CITATION LIST

Patent Literature

Patent Literature 1: JP 2017-18457 A
Patent Literature 2: JP 2019-145255 A

Non-Patent Literature

Non-Patent Literature 1: Kenichi Takai, "Importance and New development: of Analytical Technologies to Overcome Hydrogen Embrittlement of Metallic Materials," SCAB NEWS, 2009-II, Vol. 30, pp. 3-6
Non-Patent Literature 2: Kenichi Takai, "Common Bases and Recent Progress on Hydrogen Embrittlement Studies of Steels," Sanyo Technical Report, Vol. 22, 2015, No. 1, pp. 14-20
Non-Patent Literature 3: Akiko N. Itakura, et. al, "Effect of Surface Processing on Hydrogen Desorption from Stainless Steel to UHV," J. Vac. Soc. Jpn., Vol. 57, No. 1, pp. 23-26, 2014
Non-Patent Literature 4: Naoya Miyauchi, et. al, "Electron Stimulated Desorption Measurement of Permeated Hydrogen through Stainless Steel Membrane," J. Vac. Soc. Jpn., Vol. 58, No. 10, pp. 387-391, 2015

SUMMARY OF INVENTION

Problem to be Solved by the Invention

The hydrogen embrittlement fracture tends to occur at grain boundaries and areas where the tensile stress is applied and the stress is concentrated. With the existing hydrogen permeation and diffusion path observation devices, it is difficult to analyze the effect of such stress.

The present invention solves the above problem. By operating the stress, an influential factor that causes hydrogen embrittlement, etc., as an independent parameter, a target gas can be observed, independent of the effect of stress. For example, one of the objectives of the present invention is to provide a device for observing permeation and diffusion path of target gas that is applicable to the study of mechanism of embrittlement and degradation phenomena of structural materials, such as hydrogen embrittlement, due to observation target gas containing hydrogen, as well as a method of measuring observation target gas.

Another objective of the present invention is to provide a point-defect location detecting device and a method of detecting a point-defect location. Yet another objective of the present invention is to provide samples for observation suitable to be used for these device and method.

Means for Solving the Problem

The inventor, et. al have worked on the study on a device and method suitable to find the mechanism of hydrogen embrittlement, and found an idea of mechanism capable of applying the stress and introduce the distortion to samples to be observed under the operando hydrogen microscope. Our specific idea of the mechanism is as follows: a noble gas is mixed into a gas line of an observation target gas such as hydrogen, and the sample is pressed down in a non-contact manner from back surface by using total pressure (sum of the observation target gas pressure and noble gas pressure), without using an indenter, etc., with the pressure (partial pressure) of the observation target gas fixed.

The device for observing permeation and diffusion path of target gas according to the present invention comprises: a scanning electron microscope having an analysis chamber for housing a sample; an electron source for emitting an electron beam to the sample; and a secondary electron detector for detecting secondary electrons generated by the electron beam emitted to the sample; an ion detecting unit for detecting observation target ions generated by the electron beam emitted from the electron source to the sample; an observation target gas supply unit for supplying observation target gas to an observation target gas pipe connected to the back side of the sample; a diaphragm-type sample holder, to which the sample is mounted, as a diaphragm dividing between the analysis chamber and the observation target gas pipe; and a control unit, wherein the control unit obtains a SEM image based on the secondary electrons generated from the sample by electron beam scanning, turns the observation target gas, which diffuses within the sample from the back side and is discharged to the surface of the sample, into observation target ions by electron stimulated desorption by the electron beam, in a state where stress is applied to the sample due to differential pressure generated between the analysis chamber and the observation target gas pipe by supplying the observation target gas from the observation target gas supply unit; and obtains an ESD image of the observation target ions detected by the observation target ion detecting unit in synchronization with the electron beam scanning.

It is desirable that the device for observing permeation and diffusion path of target gas according to the present invention be configured so that a pressurized gas supply unit for supplying pressurized gas is connected to the observation target gas pipe to generate the differential pressure by the pressurized gas supplied from the pressurized gas supply unit.

The device for observing permeation and diffusion of observation target gas according to the present invention may be configured so that the observation target ion detecting unit comprises; a collecting mechanism for collecting observation target ions generated from the surface of the sample; an ion energy decomposing unit disposed on the top of the collecting mechanism to allow the observation target ions collected by the collecting mechanism to enter and remove components other than the observation target ions; and an ion detector for detecting observation target gas having passed the ion energy decomposing unit and outputting them to the control unit, and the collecting mechanism may be configured to have a mesh or lens fixed around the sample, and by applying a specified voltage between the mesh or lens and the ground, the observation target ions are collected and made to enter the ion detector. It is desirable that the diaphragm-type sample holder comprises a sample mounting part having an open window, and the sample is mounted to the sample mounting part so as to block the open window. The sample may be fastened to the diaphragm-type sample holder.

It is desirable that the observation target gas be any one of hydrogen, deuterium, helium, oxygen, nitrogen and water, or any one of molecules, atoms, and ions of gases related to the purpose of manufacturing or use of the sample, or any one of molecules, atoms, or ions derived from a plurality of such gases. It is favorable that the pressurized gas is at least a type of pressurized gas selected from a group consisting of helium (He), neon (Ne), argon (Ar), krypton (Kr), xenon (Xe), radon (Rn), and nitrogen (N).

The sample for observation to be mounted to the permeation and diffusion path observation device according to the present invention desirably comprises: a thin diaphragm where stress is generated due to differential pressure at the time of observation; and a thick peripheral part formed around the diaphragm part, wherein the sample is mounted to the diaphragm-type sample holder as a diaphragm dividing between the analysis chamber and the observation target gas pipe. The above sample may be a metallic flat plate, a plate material made by thinning the welded part of a metal into a thin plate, a plate material made by thinning a metal having corroded part, into a thin plate, a ceramic plate, a polymeric plate, or a plate material made of a composite material of those. It is preferable that the diaphragm of this sample is formed in a shape of a circle or a polygonal shape, and the size, thickness, and the position of the diaphragm in the thickness direction of the peripheral part are set so that the tensile stress or the compression stress is applied to the surface on the side of the analysis chamber or to the surface on the side of the observation target gas pipe due to the differential pressure generated at the time of observation.

The method of measuring observation target ions that pass through the sample by using the permeation and diffusion observation device according to the present invention includes: a gas supply process where the observation target gas is supplied from the observation target gas supply unit to apply the stress to the sample due to the differential pressure generated between the analysis chamber and the observation target gas pipe; and an image acquisition process where a SEM image is acquired by using secondary electrons generated from the sample by electron beam scanning, the observation target gas, which diffuses within the sample from the back surface of the sample and is discharged to the surface of the sample, is turned into observation target ions by the electron stimulated desorption by the electron beam, and detected by the ion detecting unit, and an ESD image is acquired in synchronization with the electron beam scanning, wherein in the image acquisition process, the position resolution of the ESD image is made to be 50 nm or less for comparison with the SEM image.

It is favorable that the gas supply process comprises: a pressurized gas supply process where the differential pressure is generated between the analysis chamber and the observation target gas pipe by supplying pressurized gas from the pressurized gas supply unit; and an observation target gas supply process where the observation target gas is supplied from the observation target gas supply unit.

It is also favorable that the differential pressure is generated by changing the pressurized gas pressure or the partial pressure of the observation target gas, or both, in the gas supply process, the image acquisition process is repeated by sequentially changing the pressure, and the behavior of discharge of the observation target gas with respect to the change in differential pressure is measured each time by based on the acquired SEM image and ESD image.

The point-defect detecting method according to the present invention detects the location of a point defect by using the above mentioned observation target gas measuring method.

The point-defect location detecting device according to the present invention comprises the above mentioned device for observing permeation and diffusion path of target gas, and a point-defect location extracting unit for detecting the location of a point defect of the sample based on the SEM and ESD images of the sample. The point-defect location detecting method according to the present invention detects atoms or molecules discharged from inside or back surface of the sample via the point defect by using such a point-defect location detecting device, and comprises steps of: preparing a sample; placing the sample in the temperature-variable holder; acquiring a SEM image of the sample; acquiring an ESD image of the sample; and identifying the location of the point defect of the sample by comparing the SEM image and the ESD image of the sample.

Effects of Invention

The present invention provides a microscopic observation device suitable to observe permeation and diffusion behavior of hydrogen gas in a state where the distortion and the stress are generated within the sample solid to be observed. More specifically, according to the permeation and diffusion path observation device of the present invention, since a sample to be observed under an operando hydrogen microscope is mounted within the analysis chamber as a diaphragm, and a desired stress is generated by differential pressure, the stress, which is an influential factor that causes hydrogen embrittlement, can be operated as an independent parameter. Therefore, according to the present invention, it becomes possible to study the mechanism of hydrogen embrittlement, independent of the effect of stress, for example. Furthermore, by using the device of the present invention, the behavior of an observation target gas can be observed in a state where the surface of a solid is distorted or the stress is applied to the surface. For example, the performance of a thin film that has the effect of sealing the observation target gas can be evaluated, and the behavior of a gas leaking from a minute structural defect that exists on the thin film can be visualized.

The method of measuring the observation target gas according to the present invention is applicable to the study of degradation mechanism in a broad sense of structural materials caused by observation target gases including hydrogen. Also, by using the point-defect location detecting device and the detecting method of the present invention, gases absorbed in a sample and those permeating from point defects within the sample, for example, can be detected, which is effective for non-destructive inspection of materials.

BRIEF DESCRIPTION OF DRAWINGS

FIG. 11A(a) to FIG. 11A(c) are a chart showing the result of stress analysis on the cross section of sample 17A obtained when the differential pressure is 0.8 MPa.

FIG. 11B(a) to FIG. 11B(c) are a chart showing the result of stress analysis on cross section of sample 17A obtained when the differential pressure is 0.4 MPa.

FIG. 11C(a) to FIG. 11C(c) are a chart showing the result of stress analysis on cross section of sample 17A obtained when the differential pressure is 0.16 MPa.

FIG. 11D(a) to FIG. 11D(c) are a chart showing the result of stress analysis on cross section of sample 17A obtained when the differential pressure is 0.08 MPa.

EMBODIMENTS OF THE INVENTION

Embodiments of the present invention will hereinafter be described in detail by referring to drawings. In the following description, hydrogen is taken as an example of observation target gas, but the target gas of the present invention is not limited to hydrogen. The observation target gas may be any one of hydrogen, deuterium, helium, oxygen, nitrogen and water, or any one of molecules, atoms, and ions of gases related to the purpose of manufacturing or use of the sample, or any one of molecules, atoms, or ions derived from a plurality of such gases.

Embodiment 1

Figure 1:
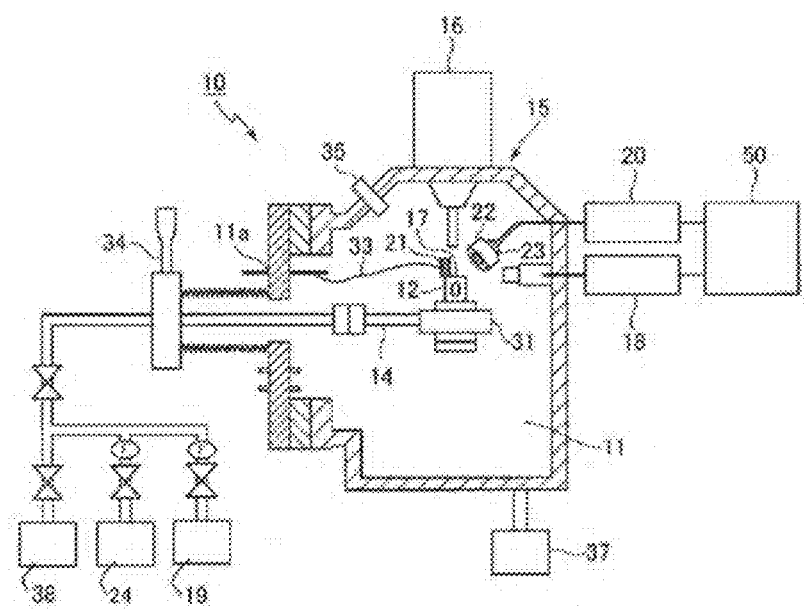
FIG. 1 is a schematic view of the internal structure of a hydrogen permeation and diffusion path observation device, which is a type of the device for observing permeation and diffusion path of a target gas according to the present invention.

First, a hydrogen permeation and diffusion path observation device, a type of the device for observing permeation and diffusion path of observation target gas, will be described. FIG. 1 schematically shows the structure of the hydrogen permeation and diffusion path observation device 10 according to Embodiment 1.

As shown in FIG. 1, the hydrogen permeation and diffusion path observation device 10 has a scanning electron microscope 15. This scanning electron microscope 15 is provided with a sample 17, an analysis chamber 11 that houses an electron source 16 for emitting an electron beam to the sample 17, and a secondary electron detector 18 that is disposed in the analysis chamber 11 to detect, secondary electrons generated from the electron beam emitted to the sample 17. The hydrogen permeation and diffusion path observation device 10 further comprises: a hydrogen ion detecting unit 20 for detecting hydrogen ions generated by the electron beam emitted from the electron source 16 to the sample 17; a hydrogen gas supply unit. 19 for supplying hydrogen to a hydrogen pipe 14 connected to the back side of the sample 17; a pressurized gas supply unit 24 for supplying pressurized gas to the hydrogen pipe 14; a diaphragm-type sample holder 12 to which the sample 17 can be attached so as to divide between the analysis chamber 11 and the hydrogen pipe 14; and a control unit 50.

The hydrogen gas supply unit 19 is connected to the diaphragm-type sample holder 12 via the hydrogen pipe 14 and the sample rack 31. The pressurized gas supply unit 24 is connected to the diaphragm-type sample holder 12 via the hydrogen pipe 14 and the sample rack 31. As a pressurized gas, noble gases such as helium (He), neon (Ne), argon (Ar), krypton (Kr), xenon (Xe), and radon (Rn), and nitrogen gas are used.

The analysis chamber 11 is provided with a sample rack 31, on which the diaphragm-type sample holder 12 is mounted, connected to the hydrogen pipe 14, a sample temperature measuring unit 33 for measuring the temperature of the sample 17, and a sample position adjusting unit 34 for adjusting the position of the sample 17.

As shown in FIG. 1, a mass analyzer 35 etc. for analyzing residual elements within the analysis chamber 11 may also be provided. The mass analyzer 35 is a quadrupolar mass analyzer, for example. The analysis chamber 11 may be further provided with an Auger electron spectroscopy analyzer. By the Auger electron spectroscopy analyzer, the amount of carbon, etc. existing on the surface of the sample 17 can be measured. The background such as hydrogen and carbon existing on the surface of the sample 17 is removed by a sputtering source provided. within the analysis chamber 11 or by electron beam irradiation before obtaining an ESD image.

The analysis chamber 11 is evacuated by a first evacuation unit 37. The first evacuation unit 37 includes a vacuum pump such as turbo molecular pump (not shown), a gate valve, a vacuum gauge, etc. The analysis chamber 11 is evacuated to $1.0 \times 10^{-7}$ Pa or lower, for example, to obtain a SEM image.

The tip of the hydrogen pipe 14 is connected with a flange to the diaphragm-type sample holder 12, to which the sample 17 is mounted, via the sample rack 31 so as to be able to supply hydrogen to the back surface of the sample 17. The base end is connected to a second evacuation unit 38 via a flange, a pipe, a stop valve, etc. The hydrogen pipe 14 is evacuated by the second evacuation unit 38. The second evacuation unit 38 is provided with a vacuum pump such as turbo molecular pump (not shown), a stop valve, a vacuum gauge, etc. The second evacuation unit 38 evacuates the hydrogen pipe 14, the sample rack 31, and the diaphragm-type sample holder 12 to specified degree of vacuum.

The hydrogen gas supply unit 19 is provided with a hydrogen gas cylinder (not shown), a pressure adjusting unit, a stop valve, a pressure gauge, etc. After the hydrogen pipe 14, the sample rack 31, and the diaphragm-type sample holder 12 are evacuated to the specified degree of vacuum, the stop valve on the side of the second evacuation unit 38 can be closed. The specified degree of vacuum is $8.0 \times 10^{-4}$ Pa or lower, for example.

Once the stop valve on the side of the hydrogen gas supply unit 19 having been made into the specified degree of vacuum is opened, hydrogen is supplied from the hydrogen gas supply unit 19 to the hydrogen pipe 14. The back surface of the sample 17 is thus exposed to hydrogen via the sample rack 31 and the diaphragm-type sample holder 12. It is desirable to use deuterium as hydrogen gas so that it can be distinguished from the hydrogen gas remaining within the analysis chamber 11 as background.

Figure 2:
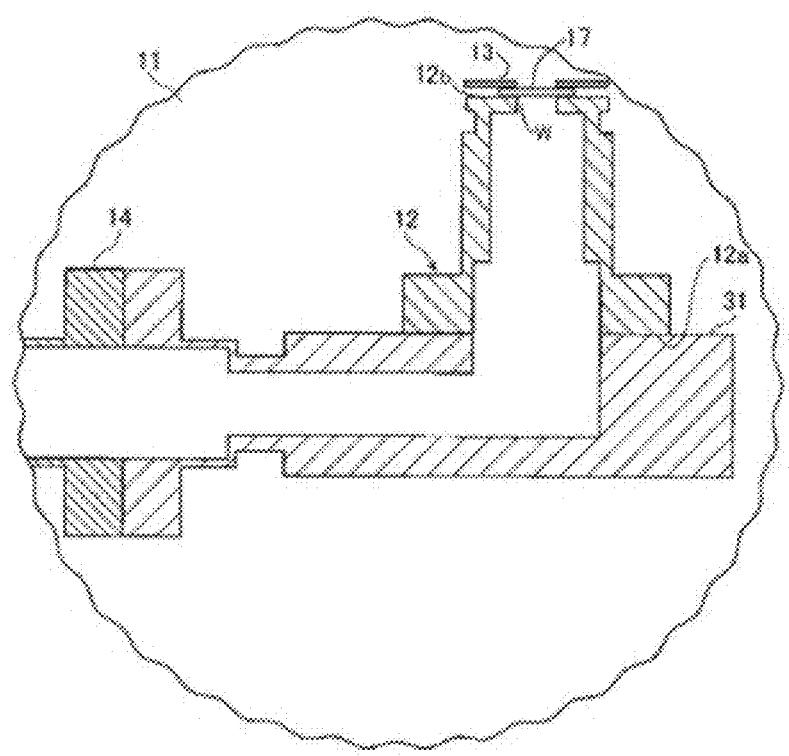
FIG. 2 is a partial cross-sectional view showing the relation between a diaphragm-type sample holder and a hydrogen pipe etc. connected to the diaphragm-type sample holder.

FIG. 2 is a cross-sectional view showing the relation between the diaphragm-type sample holder 12 and the hydrogen pipe 14, etc. connected to the diaphragm-type sample holder 12. The diaphragm-type sample holder 12 includes a flange 12a and a sample mounting part 12b that is connected to the top part of the flange 12a and has an open window W. The open window W of the sample mounting part 12b is blocked with the sample 17. The window frame area around the open window W of the diaphragm-type sample holder 12 abuts against the sample 17 on the outer perimeter. The interface between the window frame area around the open window W of the diaphragm-type sample holder 12 and the sample 17 is sealed by using a general vacuum sealing method such as elastomeric seal, metal gasket seal, etc. to ensure vacuum sealing.

As the flange 12a, a single pipe with an ICF34 (international standard) flange is used, for example. The sample mounting part 12b can be structured by using copper to ensure good heat conductance.

The sample 17 is retained by the sample fixing plate 13 on the outer periphery at the top of the sample mounting part 12b of the diaphragm-type sample holder 12. Not only one but also two or more samples 17 can be mounted on the sample mounting part 12b. The sample 17 may be in a size having 16-mm diameter and 1-mm thickness, provided that it has a shape capable of blocking the window area of the open window W. This hydrogen permeation and diffusion observation device 10 can measure the discharge of either the gases adsorbed to, contained in, and dissolved in the sample 17 mounted to the sample mounting part 12b or atoms constituting those gases.

In this embodiment, the diaphragm-type sample holder 12 is disposed together with the sample rack 31 between the analysis chamber 11 and the hydrogen pipe 14. The sample 17 is mounted so as to block the open window W of the sample mounting part 12b of the diaphragm-type sample holder 12, which allows the sample 17 to function as a diaphragm dividing between the analysis chamber 11 and the hydrogen pipe 14. The figure shows an example where the sample 17 is mounted to the sample mounting part 12b in attachable/detachable state, but it is also possible to fasten the sample 17 by welding so as to block the open window W of the sample mounting part 12b. The welded sample 17 may be a thin plate made of iron, steel, and stainless steel. The thickness of the part of the sample 17 to be measured and disposed as a diaphragm may be approximately the same as the grain size of the sample. For example, approximately 100 to 300 µm is allowed, but it is desirable that an outer peripheral part of 500 to 2000 µm be provided as a part related to welding.

Figure 3:
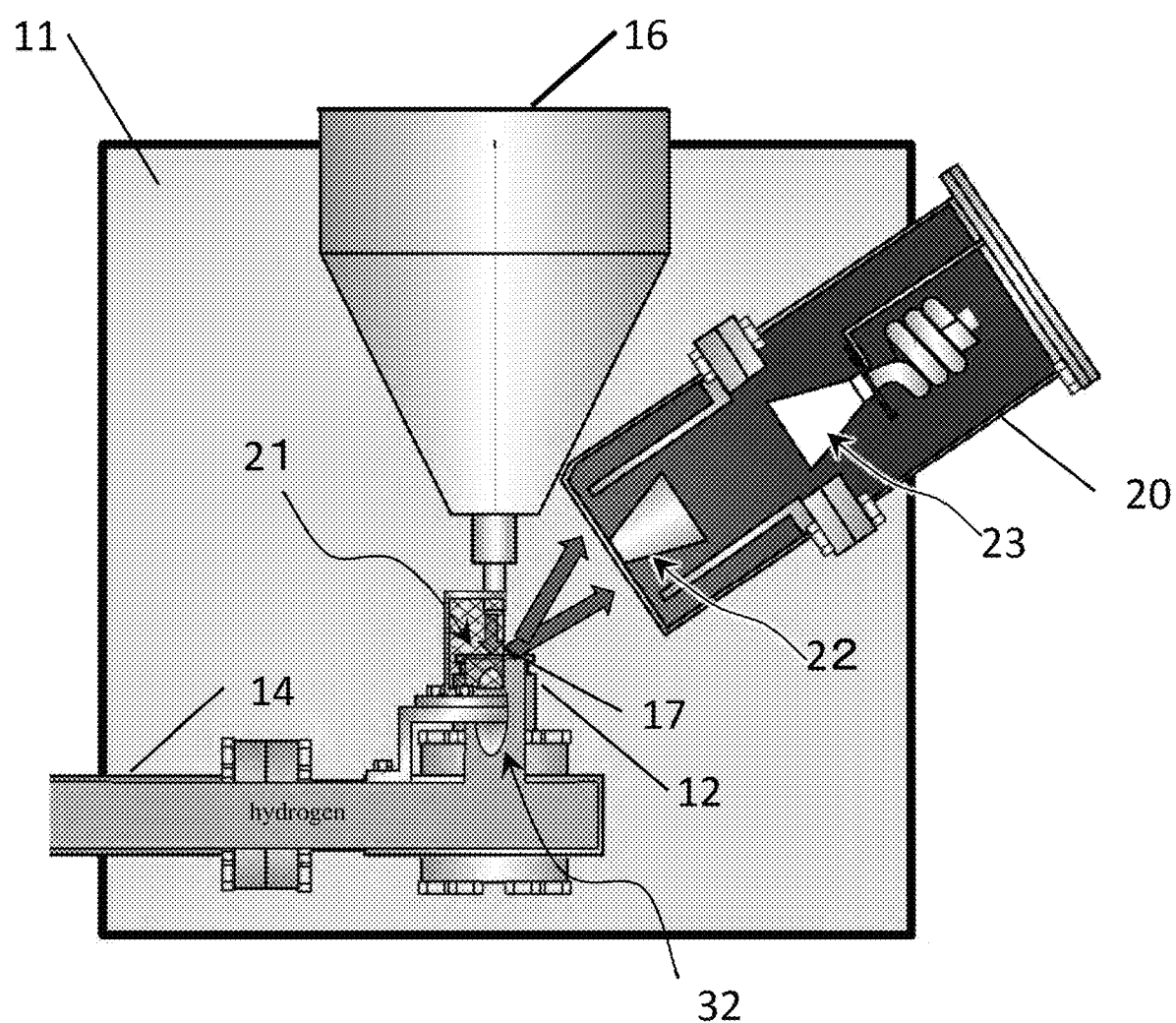
FIG. 3 is a magnified schematic view showing the relation among the hydrogen ion detecting unit, the diaphragm-type sample holder, and the hydrogen pipe etc. connected to the diaphragm-type sample holder within the analysis chamber in Embodiment 1.

FIG. 3 is a partial magnified view showing the arrangement of the hydrogen ion detecting unit 20, the diaphragm-type sample holder 12, the hydrogen pipe 14 connected to the diaphragm-type sample holder 12 via the sample rack 31 etc. within the analysis chamber 11. The hydrogen ion detecting unit 20 includes: a collecting mechanism 21 for collecting hydrogen ions generated from the surface of the sample 17 an ion energy decomposing unit 22 for removing the matter other than hydrogen ions; and an ion detector 23 for detecting hydrogen ions having passed the ion energy decomposing unit 22.

The hydrogen ion detecting unit 20 detects hydrogen ions generated on the surface of the sample 17 by the ESD method. A two-dimensional image of hydrogen ions detected by electron beam scanning is called an ESD image or an ESD map.

On the sample rack 31, a sample heater 32 is disposed to increase the temperature of the sample 17 to become higher than the room temperature, thus promoting diffusion of hydrogen. The temperature of the sample 17 to be heated is measured by the sample temperature measuring unit 33 as shown in FIG. 1. As a temperature sensor used for this sample temperature measuring unit 33, a thermocouple made of copper and constantan, for example, can be used. The thermocouple may be connected to the sample 17 by welding. The lead wire of the thermocouple is connected to a conducting wire draw-out port 11a disposed within the analysis chamber 11. The electromotive force generated in the thermocouple due to heating temperature of the sample 17 is measured by a voltmeter connected to the external terminal of the conducting wire draw-out port 11a, and thus the temperature of the sample 17 can be measured. A temperature adjusting mechanism is disposed to detect this voltage, feeding it back to heater current and thus maintaining the temperature at a constant level. In this case, the sample heater 32 may be disposed at a position other than the hydrogen pipe 14.

The surface of the sample 17 retained by the diaphragm-type sample holder 12 is exposed on the side of the analysis chamber 11, and its back side is exposed on the side of the hydrogen pipe 14. The diaphragm-type sample holder 12 is fastened to the sample rack 31 by screws, etc. The sample 17 is heated by the sample heater 32. The sample heater 32 is a halogen lamp, for example.

In the proximity of the surface of the sample 17, the collecting mechanism 21 is disposed to efficiently collect: discharged ions. The collecting mechanism 21 shown is a lens in grid structure made of a metal wire mesh, for example. The ions of the target gas collected by the collecting mechanism 21, hydrogen ions for example, enter the hydrogen ion detecting unit 20. The ion energy decomposing unit 22 sorts hydrogen ions, for example, and makes them enter the ion detector 23.

The ion energy decomposing unit 22 is a metal electrode made in a shape of a cover to prevent the ion detector 23 from directly facing the sample 17. As the ion energy decomposing unit 22, a cylindrical or conical electrode can be used. The ion energy decomposing unit 22 can apply appropriate positive voltage to the cylindrical electrode, introduce the ions of the target gas only, hydrogen ions, for example, into the ion detector 23 by the electric field, and remove the light and electrons generated by the irradiation of the electron beam to the sample 17. As the ion detector 23, a Ceratron and a secondary electron multiplier can be used. (ESD)

Figure 4:
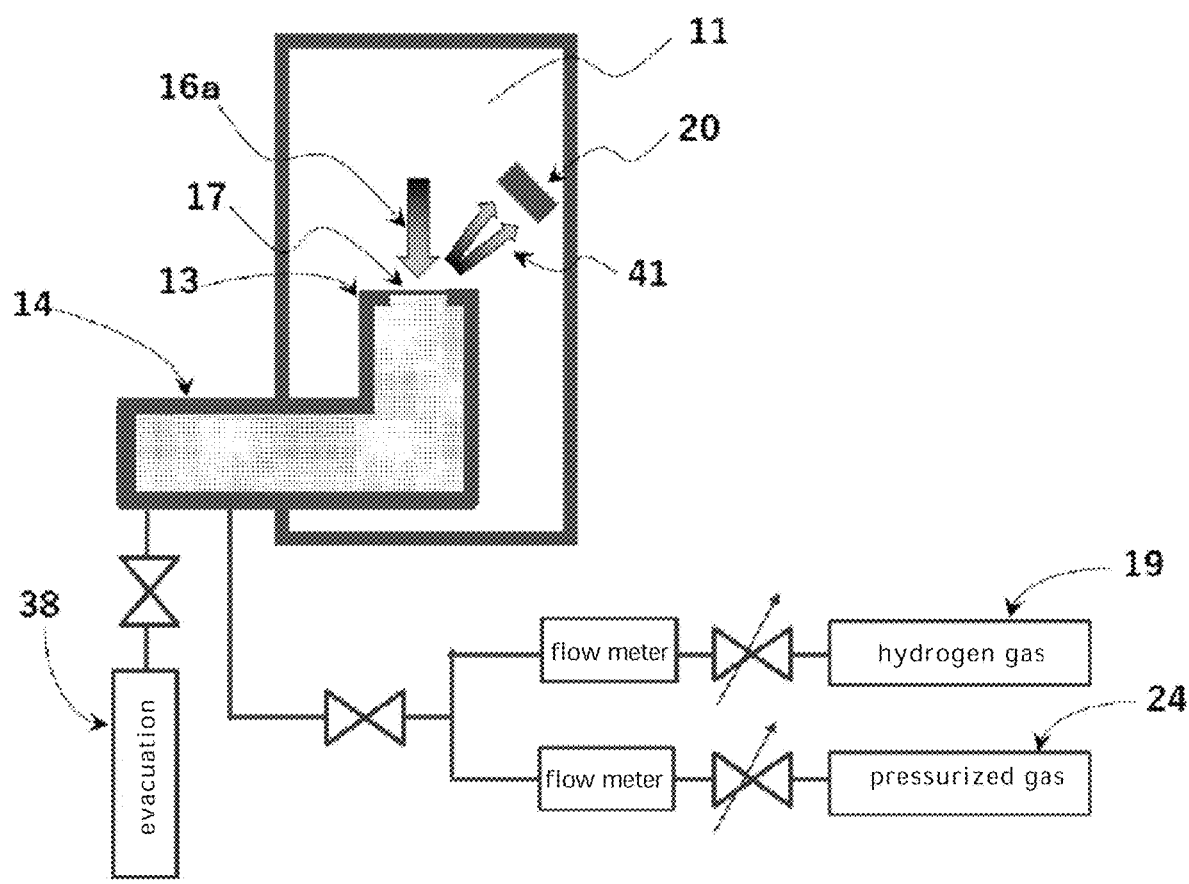
FIG. 4 is a schematic view showing the principle of detecting hydrogen ions generated due to electron stimulated desorption when an electron beam is emitted to the sample.

FIG. 4 is a schematic view showing the detection of hydrogen ions 41 generated due to electron stimulated desorption when an electron beam 16a is emitted to the sample 17. As shown in FIG. 4, the analysis chamber 11, the hydrogen pipe 14, and the sample rack 31 are divided by the sample 17 functioning as a partition wall. In other words, the sample 17 is mounted so as to operate as a diaphragm between the analysis chamber 11 and the hydrogen pipe 14 via the sample rack 31. In the analysis chamber 11, the electron beam 16a is emitted to the surface of the sample 17, and hydrogen ions 41 are generated from the sample 17.

On the back side of the sample 17 are the hydrogen pipe 14 and the sample rack 31, to which hydrogen is introduced at a specified pressure after evacuation. The hydrogen pipe 14 also operates as a vacuum vessel. Hydrogen introduced into the sample 17 from the back side of the sample 17 diffuses within the sample 17, reaches at the front surface of the sample 17, and then is discharged. In other words, Hydrogen or deuterium permeate from the back side to the front side the sample 17. The electron beam 16a is emitted to hydrogen that has reached to the front surface of the sample 17, which allows hydrogen ions 41 having detached from the sample 17 due to electron stimulated desorption (ESD) to leave from the sample 17 and be collected by the collecting mechanism 21. These hydrogen ions 41 are detected by the hydrogen ion detecting unit 20.

(Control Unit)

Figure 5:
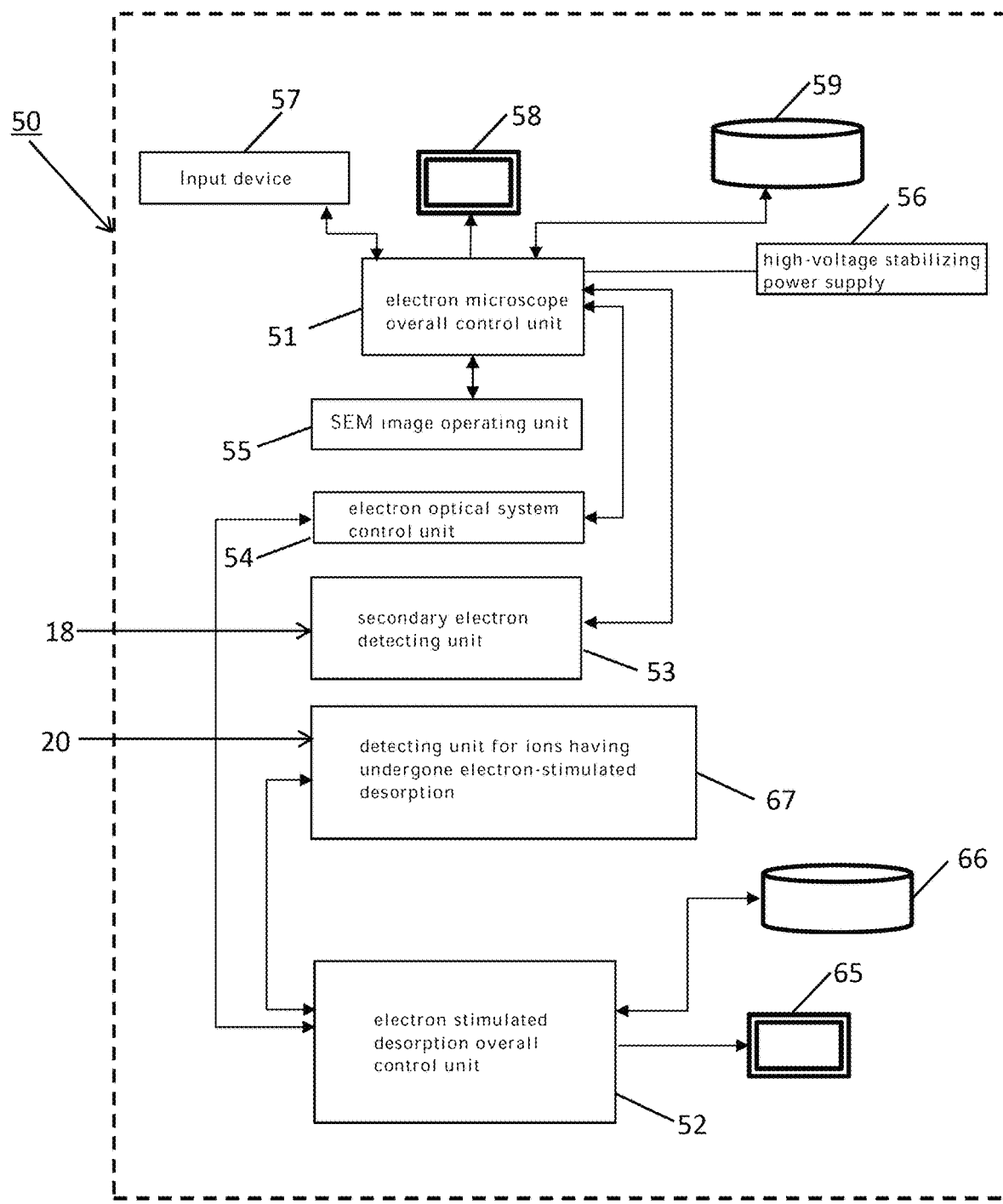
FIG. 5 is a block diagram showing the structure of a control unit of the present invention.
Figure 6:
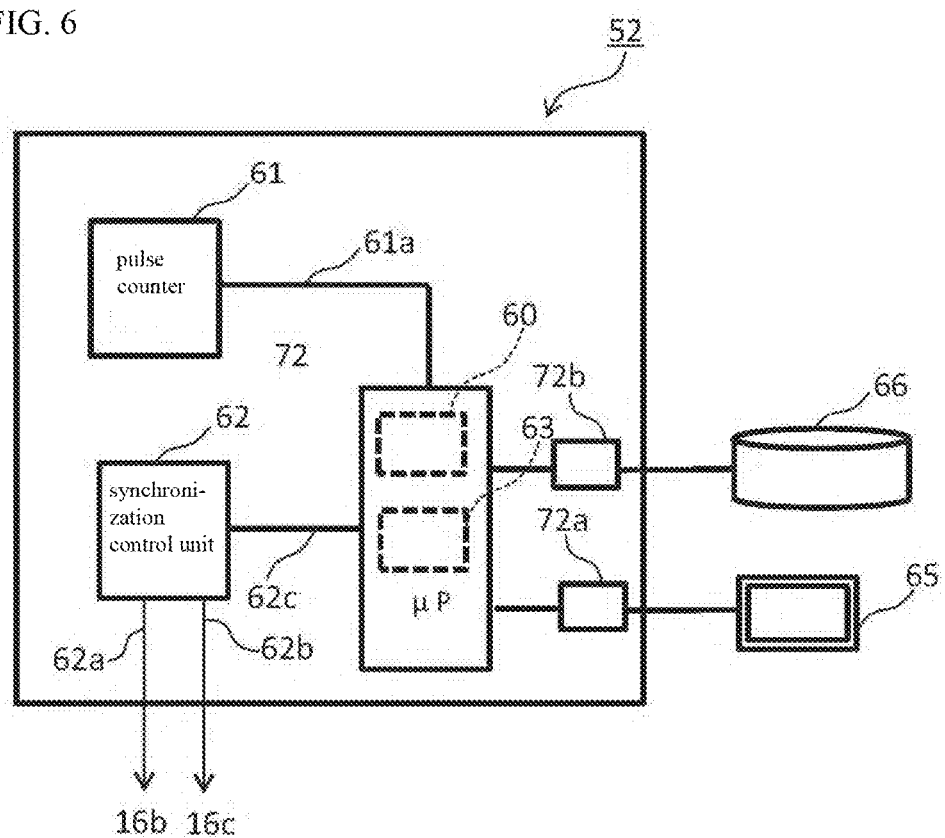
FIG. 6 is a block diagram showing the structure of the electron stimulated desorption overall control unit.

FIG. 5 is a block diagram of a control unit 50, and FIG. 6 is a block diagram showing the structure of the electron stimulated desorption overall control unit 52.

As shown in FIG. 5, the control unit 50 includes an electron microscope overall control unit 51 for controlling the scanning electron microscope 15 and an electron stimulated desorption overall control unit 52 for controlling the acquisition of ESD images. The electron microscope overall control unit 51 is comprising: a secondary electron detecting unit 53 for acquiring a scanning electron microscopic image (SEM image) of the sample 17; an electron optical system control unit 54; a SEM image operating unit 55; a high voltage stabilizing power supply 56; an input device 57; a display 58; a memory unit 59, etc., and is structured to control each of those components. The output from the secondary electron detector 18 placed within the analysis chamber 11 is input into the secondary electron detecting unit 53.

(Electron Stimulated Desorption Overall Control Unit)

As shown in FIG. 6, the electron stimulated desorption overall control unit 52 for controlling the acquisition of an ESD image includes; a two-dimensional multi-channel scaler 60; a pulse counter 61; a synchronization control unit 62; a unit for sorting measured signals to two-dimensional plane 63; and a microprocessor 72, etc.

The output from the ion detecting unit 20 housed in the analysis chamber 11 is input into the pulse counter 61 via a detecting unit for ions having undergone electron stimulated desorption 67. To the electron stimulated desorption overall control unit 52, scanning signals are input from the electron optical system control unit 54, and the electron stimulated desorption overall control unit 52 is controlled by being synchronized with the SEM image. Furthermore, a display 65 and a memory unit 60 are connected to the electron stimulated desorption overall control unit 52.

The microprocessor 72 may be a microcomputer such as a microcontroller, a personal computer, and a field-programmable gate array (FPGA).

With this electron stimulated desorption overall control unit 52, the scanning signal input from the electron optical system control unit 54 to the synchronization control unit 62 is output to a first deflection coil 16b of the electron source 16 via the synchronization control unit 62 as a vertical scanning signal 62a.

A horizontal scanning signal 62b from the synchronization control unit 62 is output to a second deflection coil 16c of the electron source 16. The information on the scanning position 62c from the synchronization control unit 62 is output to the microprocessor 72.

A hydrogen ion count signal 61a output from the pulse counter 61 is output to the microprocessor 72 as a hydrogen ion count signal of each scanning position. The hydrogen ion counts for each sample position counted by the pulse counter 61 may be integrated by obtaining the ESD image within a specified shooting time to acquire the count of hydrogen ions having permeated the sample 17.

The ESD image generated by the microprocessor 72 is output to the display 65 via an input/output (I/O) interface 72a, and also output to the memory unit 66 via an I/O interface 72b.

Figure 7:
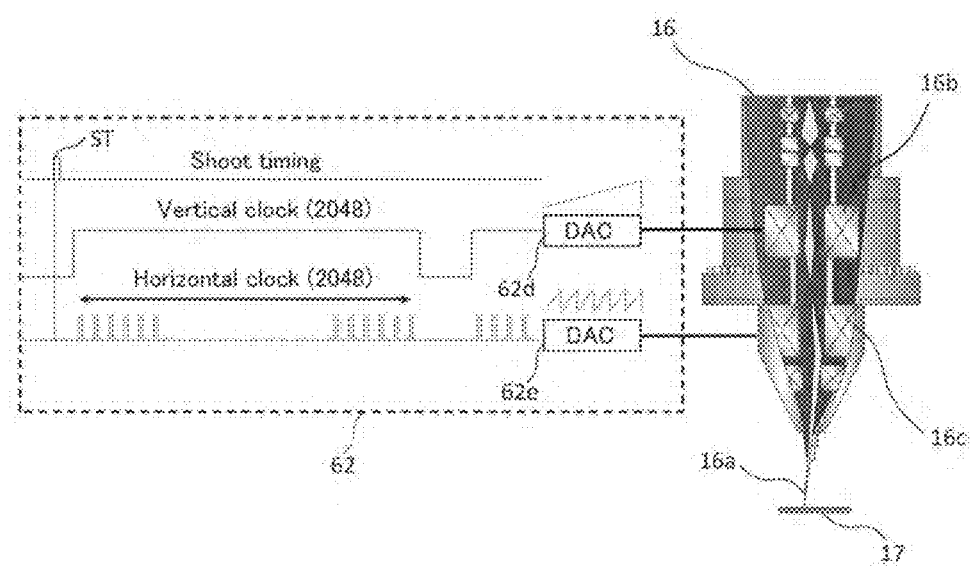
FIG. 7 is a schematic view showing the relation between the electron beam scanning and the two-dimensional measurement of an ESD image.

The operation of the electron stimulated desorption overall control unit 52 will hereinafter be described. FIG. 7 is a schematic view showing the relation between the scanning by the electron source 16 and the two-dimensional measurement of the ESD image. The electron beam 16a generated from the electron source 16 is scanned in the vertical and horizontal directions while passing through the first deflection coil 16b and the second deflection coil 16c, and emitted two-dimensionally to the sample 17.

The vertical scanning signal generated at the synchronization control unit 62 as shown in FIG. 7 is a digital clock signal. The vertical scanning signal is converted into a sawtooth wave by a digital-analog converter (DAC) 62d and applied to the first deflection coil 16b of the electron source 16. Similarly, the clock signal, which is a horizontal digital scanning signal, is converted into a sawtooth wave by the digital-analog converter (DAC) 62e, and applied to the second deflection coil 16c of the electron source 16.

The control is started by 1-pulse shoot timing signal (ST signal) so that a vertical scanning signal generates 2048 pulses in total.

During one pulse width of one-pulse vertical scanning signal, the horizontal pixel signal (horizontal clock) outputs 2048 pulses in total. Accordingly, the two-dimensional scanning having approximately 4,190,000-pixel (2048 lines×2048 columns=4,194,304) are generated. In other words, the signals counted by the pulse counter 61 can be obtained as the count of hydrogen ions from the ion detector 23 at each scanning position by synchronizing a plurality of counters for ST signals, clock signals for vertical scanning, and clock signals for horizontal scanning.

Shooting timing signals can be changed according to the type, magnification, and resolution of the electron microscope used. For example, 1024-pulse vertical scanning signals and 1024-pulse horizontal pixel signals, or 900-pulse vertical scanning signals and 1,200-pulse horizontal pixel signals, etc. may be used.

(How to Acquire an ESD Image)

Figure 8:
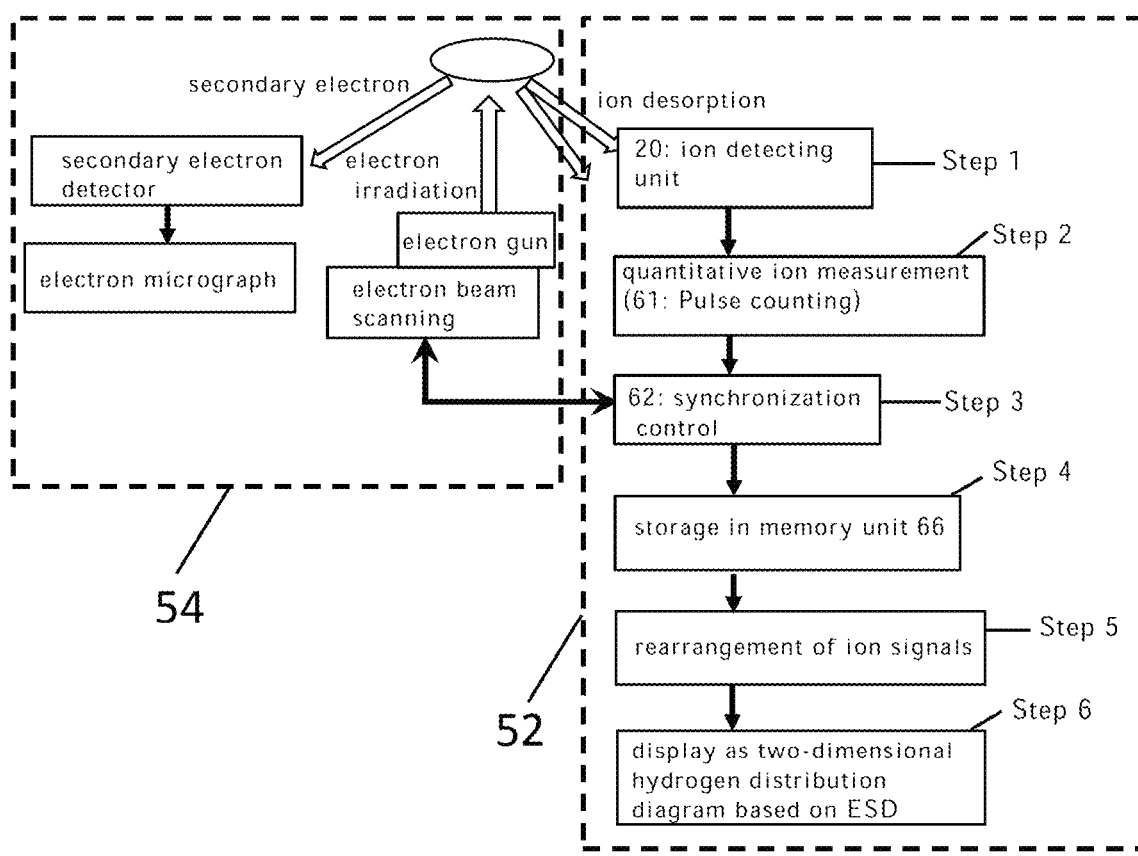
FIG. 8 is a flow chart for measuring a two-dimensional ESD image by electron beam scanning.

FIG. 8 is a flow chart for measuring a two-dimensional ESD image by scanning. As shown in the chart, a two-dimensional ESD image can be obtained by following the steps as shown below.

Step 1: Ions having left the surface of the sample 17 are detected by the ion detector 23 of the ion detecting unit 20.

Step 2: The pulse counter 61 performs the quantitative measurement of ions detected by the ion detector 23.

Step 3: The synchronization control unit 62 for generating a clock signal for vertical scanning and the clock signal for horizontal scanning as shown in FIG. 7 counts ions at each two-dimensional measurement point of the sample 17.

Step 4: The count of ions at each two-dimensional measurement point of the sample 17 is stored in the memory of the memory unit 66.

Step 5: Based on the clock signal for vertical scanning and the clock signal for horizontal scanning, ion signals stored in the memory unit 66 are re-arranged as a two-dimensional image.

Step 6: The ESD image obtained in step 5 is displayed on the display 65, and stored in the memory unit 66 as the image and the numerical data.

The ESD image in the same region as the SEM image can be obtained by following the above steps.

The acquisition of the ESD images following the steps 1 to 6 mentioned above can be executed using software created in a program creation environment exclusive for measuring instrument control. As such software, LabVIEW by National Instruments (http://www.ni.com/labview/ja/) can be used. The ESD image can be obtained by steps 1 to 6 mentioned above, using two-dimensional multi-channel scaler 60 executed by the program created by LabVIEW in the microprocessor 72.

(How to Measure Hydrogen Ions)

To measure hydrogen ions permeating the sample 17 by using the hydrogen permeation and diffusion path observation device 10 described above, the stress is applied to the sample 17 mounted to the diaphragm-type sample holder 12 in the gas supply process. In the image acquisition process, secondary electrons discharged from the sample by scanning the electron beam 16a emitted from the electron source 16 are acquired as a scanning electron microscopic image (SEM image), and atoms diffusing within the sample from the back surface and discharged on the front surface, hydrogen atoms for example, are made to become hydrogen ions by electron stimulated desorption (ESD), and the ESD image of hydrogen ions is acquired in synchronization with electron beam scanning. In this image acquisition process, it is desirable that the position resolution of the ESD image be 50 nm or lower to compare the image with the SEM image. In this case, it is favorable that the surface of the sample 17 is etched before acquiring and observing the SEM image. It is also desirable that grain boundary be identified from the SEM image, and that the identified grain boundary be displayed overlapped with the SEM and ESD images. By examining the correspondence between the crystal grain and the hydrogen ion distribution obtained by the ESD image, the structural information on hydrogen ion release position in crystal grain can be obtained.

To apply the stress on the surface of the sample according to the present, invention, it is only necessary to apply the vacuum pressure of 0.1 MPa or lower on the top surface of the sample and the sum of hydrogen partial pressure and the noble gas partial pressure of "P" MPa on the bottom surface of the sample by using various samples as shown in FIG. 9 to FIG. 18 to be described later, for example. As shown in FIG. 2 and FIG. 4, the sample 17 is mounted at the sample mounting part 12b of the diaphragm-type sample holder 12, blocking the open window W, as the diaphragm dividing between the analysis chamber 11 and the hydrogen pipe 14. The analysis chamber 11 is then evacuated to have the sufficient degree of vacuum, and the hydrogen gas supply process for supplying hydrogen gas from the hydrogen gas supply unit 19 to the hydrogen pipe 14 and the pressurized gas supply process for supplying noble gas as the pressurized gas from the pressurized gas supply unit 24 to the hydrogen pipe 14 are executed simultaneously or sequentially. In this way, by the sum of hydrogen gas partial pressure and the noble gas partial pressure, the differential pressure is generated between the front surface and the back surface of the sample 17. Since the noble gas partial pressure can be selected independently in a range from more than 0% to below 100% with respect to hydrogen, by selecting the noble gas partial pressure as required, a desired stress such as the tensile stress and the compression stress can be generated on the front surface and the back surface of the sample 17 independently from the amount of existing hydrogen gas.

Typical samples 17 appropriate to measure hydrogen ions by applying stress by the differential pressure (5 types 17A to 17E, are shown below) will be described.

(Sample 17A)

Figure 9A:
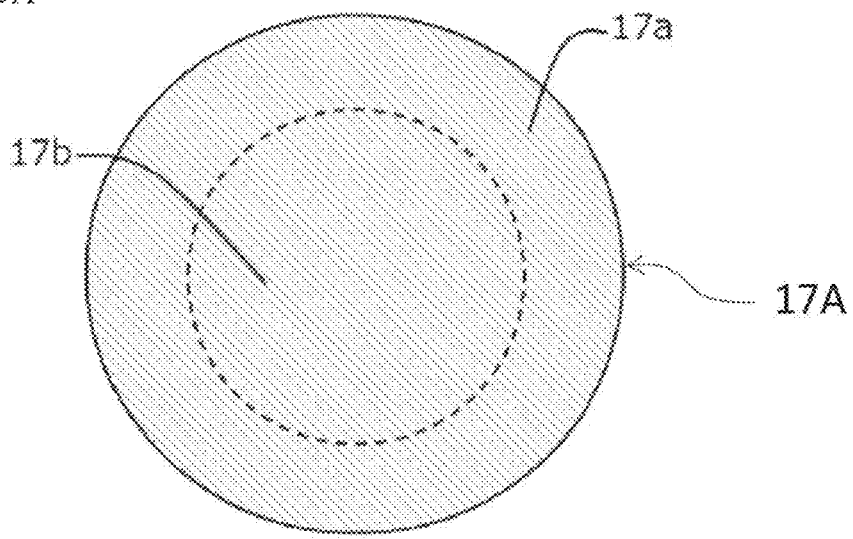
FIG. 9A is a top view of sample 17A showing an example of the shape of the sample targeted for stress analysis according to the present invention.
Figure 9B:
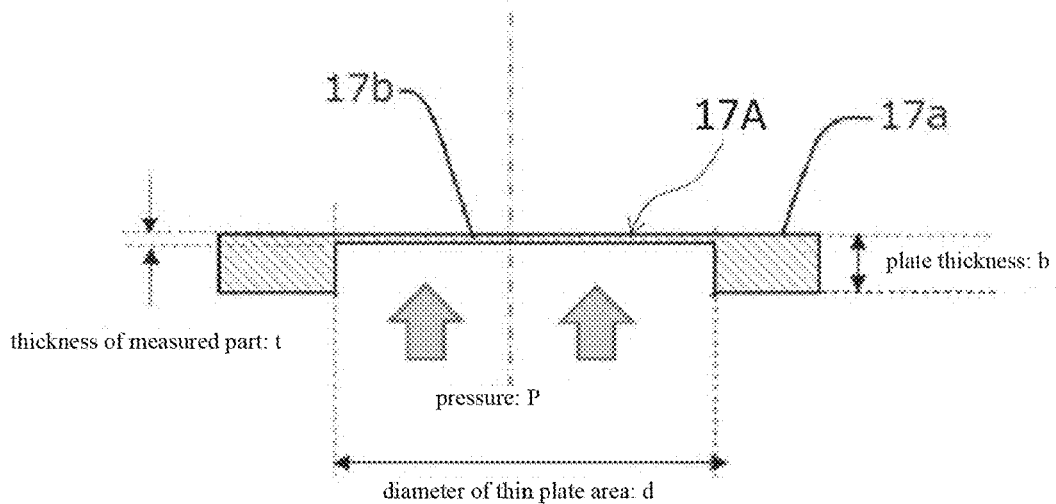
FIG. 9B is a cross-sectional view of sample 17A.
Figure 9C:
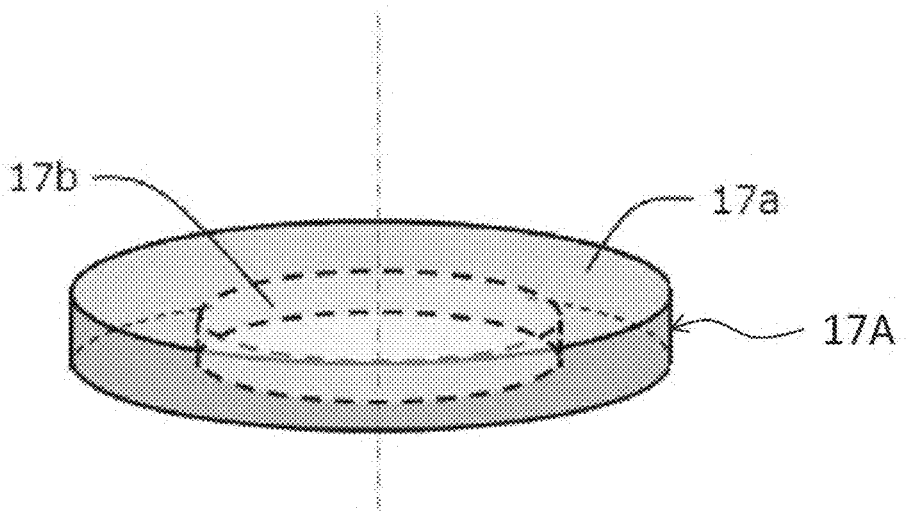
FIG. 9C is an oblique perspective view of sample 17A.

FIG. 9A to FIG. 9C are configuration diagrams showing an example (sample 17A) of the shape of the sample targeted for stress analysis of the present invention.

At the center of a disk-shaped metal plate having plate thickness b of 1 mm, a hole (concave) having diameter d of 10 mm and thickness of 0.9 mm was fabricated in a concentric fashion. By leaving a thin plate part having thickness t of 0.1 mm, sample 17A having a diaphragm part 17b in a thin plate part at the inner center of the thick circular part 17a was fabricated. With this sample 17A, the diaphragm part 17b is a pressure-sensitive area. By fixing the inner periphery of the circular part 17a adjacent to the diaphragm part 17b of the sample 17A, and applying a load of pressure P from one face, the stress is generated to the diaphragm part 17b.

Figure 10:
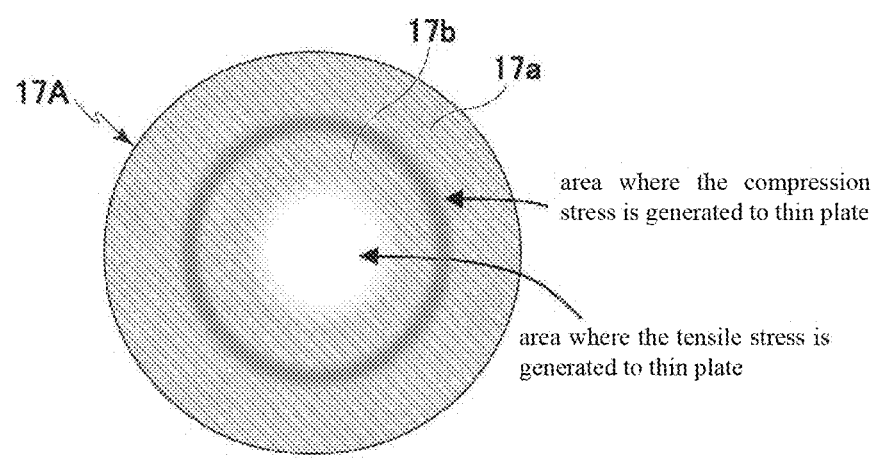
FIG. 10 is a plan view explaining the stress distribution on sample 17A.

FIG. 10 is a plan view explaining the stress distribution on sample 17A. The tensile stress is generated in the central area of the diaphragm part 17b. Meanwhile, in the boundary area between the circular part 17a and the diaphragm part 17b, the compression stress is generated on the surface.

FIG. 11A(a) to FIG. 11D(c) show the results of stress analysis on the cross section of the shape of the sample 17A performed by using the finite element method (FEM). FIG. 11A(a) to FIG. 11D(c) show the analysis results obtained when the differential pressure was 0.8 MPa, 0.4 MPa, 0.16 MPa, and 0.08 MPa, respectively. The actual stress analysis results are shown in shading of different colors, with higher tensile stress generated at each part shown in darker red, and higher compression stress shown in darker blue. In FIG. 11A(a) to FIG. 11D(c), the intensity of tensile stress and that of compression stress are shown by the shading of black color.

FIG. 11A(a) shows the result of analysis of the area on the cross section of sample 17A from the edge to the axis of symmetry (corresponds to the broken line in FIGS. 9B, 9C, and 9D). FIG. 11A(b) shows magnified view of the analysis result of the diaphragm part 17b around the axis of symmetry of sample 17A. FIG. 11A(c) shows the magnified view of the analysis result of the diaphragm part 17b in proximity to the fastening end of sample 17A. The same is applicable to FIG. 11B(a) to FIG. 11D(c).

FIG. 11A(a) and FIG. 11A(c) reveal that the top surface, which is the upper part, and the back surface, which is the lower part, in the figures are shown dark at around the fixing end of the diaphragm part 17b. More specifically, the top surface is an area where the intensity of compression stress is high (shown in blue color on the analysis screen), whereas the back surface was an area where the intensity of tensile stress is high (shown in red color on the analysis screen). The results were the same with FIG. 11B(a) to FIG. 11D(c). These results indicate that bending stress (approximately 214 MPa in FIG. 11D, for example) concentrated on the boundary area adjacent to the fixing end of the diaphragm part 17b even when the thickness was 0.1 mm.

Meanwhile, FIG. 11A(b) shows the high-intensity tensile stress (shown in orange color on the analysis screen) in most of the central area around the axis of symmetry of the diaphragm part 17b, including the top side, although the clear contrasting density cannot be identified with grayscale, and the slight compression stress was exhibited (shown in pale blue color on the analysis screen) on the back side. The result indicates that the compression component on the back surface of the diaphragm part 17b decreases with the increase of differential pressure, hence with the progress of plastic deformation.

Furthermore, by comparing FIG. 11A(b), FIG. 11B (b) and FIG. 11C(b), it was found that the tensile stress on the top surface and the compression stress on the back surface gradually decreased with the decrease of differential pressure. Also, in FIG. 11D(b), the intensity of tensile stress (shown in orange-yellow color on the analysis screen) on the top surface and the intensity of compression stress (shown in pale blue color on the analysis screen) on the back surface exhibited equal proportion.

The analysis results in FIG. 11A(a) to FIG. 11D(c) show the following: in the central area of the diaphragm part 17b, when the differential pressure is small enough to be within elastic deformation range, as shown in FIG. 11D(a) to FIG. 11D(c), the tensile stress on the top surface and the compression stress on the back surface are generated symmetrically, and when the differential pressure increases, causing significant plastic deformation, as shown in FIG. 11A(a) to FIG. 11A(c), the area and the magnitude of compression component on the back surface decreased, compared to the area and the magnitude of the tensile stress on the front surface.

Consequently, by setting the differential pressure on the front surface and on the back surface of sample 17A as required, the desired tensile stress and the compression stress can be generated in each part. When observing permeation of hydrogen, by changing the pressure of the pressurized gas from the pressurized gas supply unit 24, with hydrogen partial pressure fixed, the magnitude of stress to be applied to the measurement sample can be controlled according to the magnitude of total pressure P.

(Sample 17B)

Figure 12A:
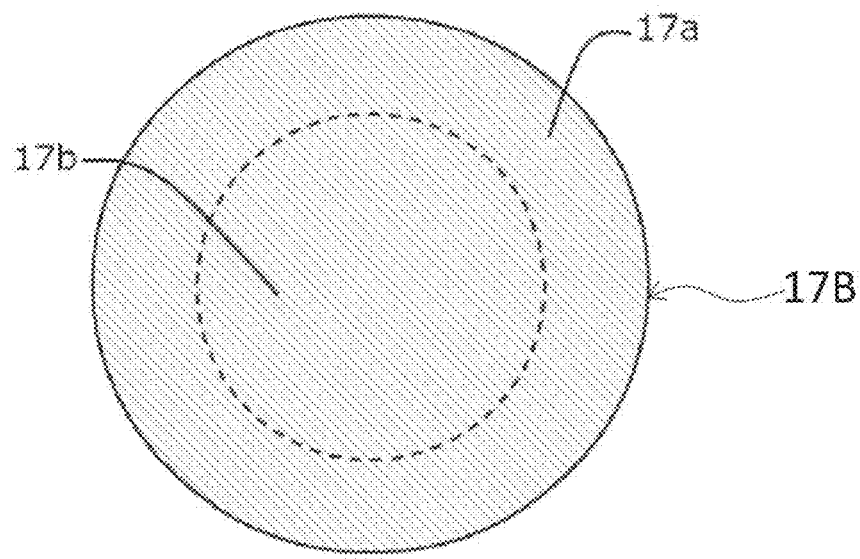
FIG. 12A is a top view of sample 17B showing another example of the shape of the sample targeted for stress analysis according to the present invention.
Figure 12B:
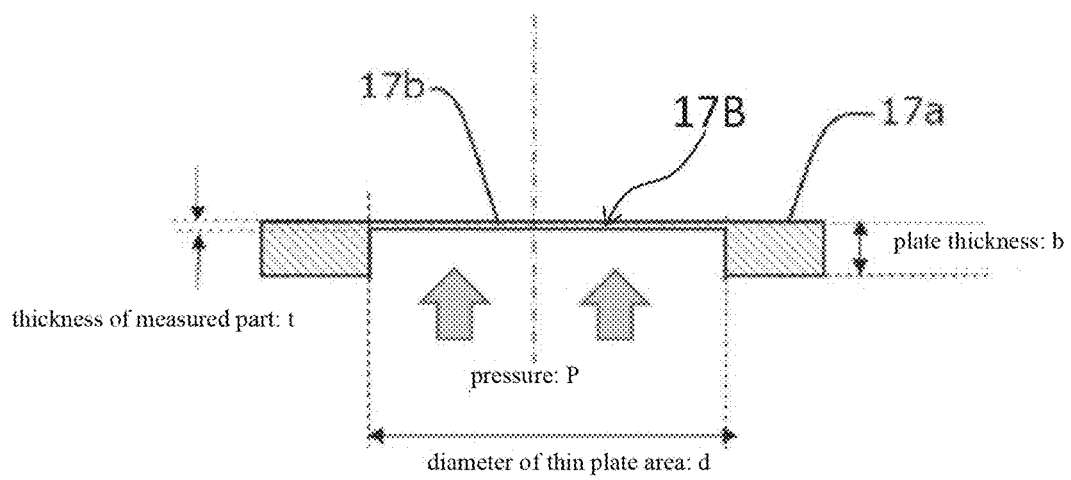
FIG. 12B is a cross-sectional view of sample 17B.
Figure 12C:
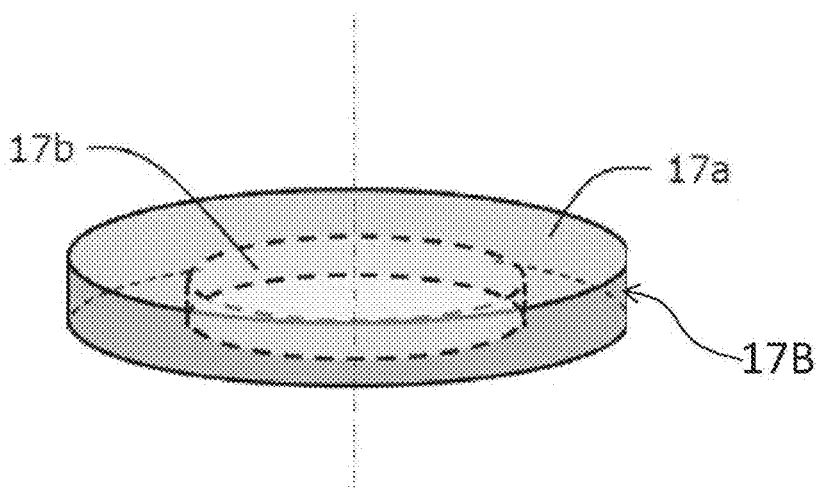
FIG. 12C is an oblique perspective view of sample 17B.

FIG. 12A to FIG. 12C are configuration diagrams showing another example (sample 17B) of the shape of the sample targeted for stress analysis according to the present invention, where FIG. 12A is a top view, FIG. 12B is a cross-sectional view, and FIG. 12C is an oblique perspective view. At the center of a disk-shaped metal plate having a plate thickness b of 0.5 mm, a hole (concave) having diameter of 10 mm and thickness of 0.4 mm was fabricated in a concentric fashion. By leaving a thin plate part having thickness t of 0.1 mm, sample 17B having a diaphragm part 17b in the thin plate part at the inner center of the thick circular part 17a, was fabricated.

Figure 13A:
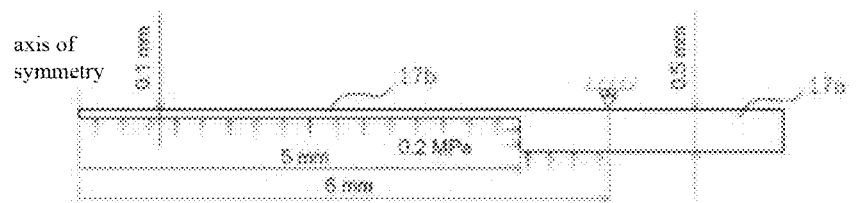
FIG. 13A is an example of the shape and actual dimensions for stress calculation of sample 17B.
Figure 13B:
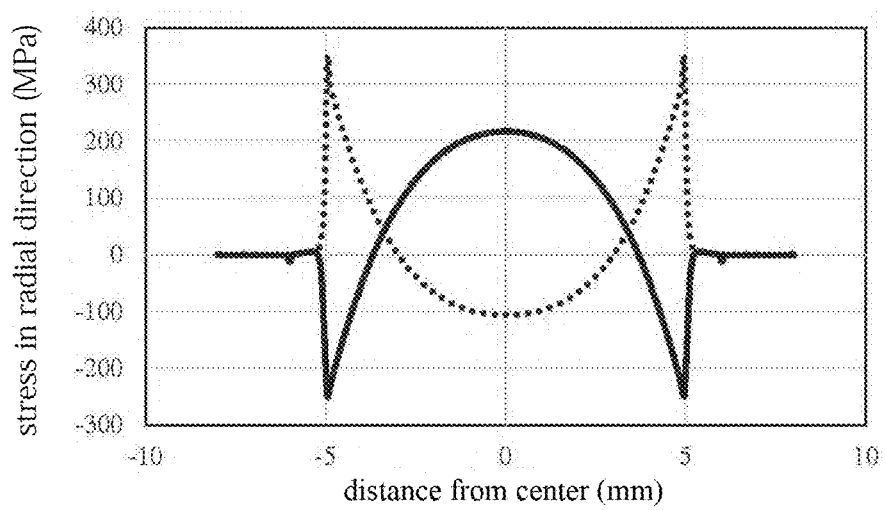
FIG. 13B is a chart showing the result of stress calculation of sample 17B.
Figure 13C:
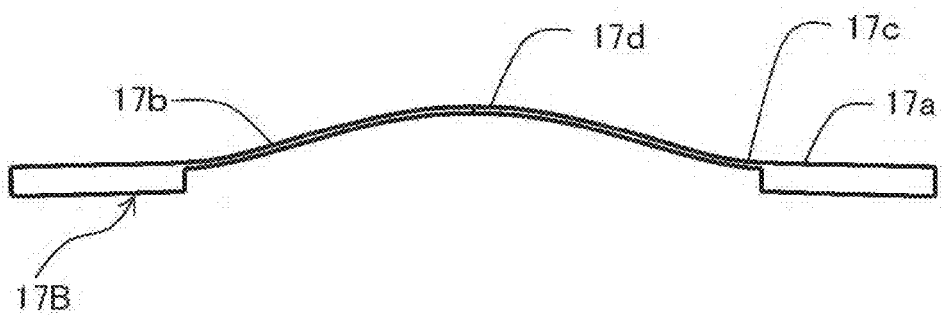
FIG. 13C is a schematic view showing the distortion of sample 17B reflecting the calculation result in FIG. 13B.

FIG. 13A to FIG. 13C explain the result of stress analysis of the shape of the sample 17B as shown in FIG. 12A to FIG. 12C performed by using the finite element method (FEM) when P is 0.2 MPa, where FIG. 13A shows boundary conditions of the finite element method analysis using a two-dimensional axial symmetry model, FIG. 13B shows the stress distribution in the radial direction on the top and bottom surfaces of the sample obtained by the analysis, and FIG. 13C shows a deformation diagram with 20 deformation magnification obtained by the analysis. It was found that in the central area of the diaphragm part 17b, the convex-shaped deformation was generated, and on the top surface of area 17d, the approximately 220-MPa tensile stress was being applied (solid line in FIG. 13B). Meanwhile, on the bottom surface of area 17d, 100-MPa compression stress is being applied (broken line in FIG. 13B). Also, on the top surface of area 17c around the boundary between the diaphragm part 17b and the circular part 17a, approximately 250-MPa compression stress was being applied, and on the bottom surface of area 17c, 350-MPa tensile stress was being applied. It was thus found that by applying stress from the bottom side of the shape of the sample in FIG. 12, stress in reverse directions are applied on the top and the bottom surfaces in both areas 17d and 17c of the sample 17.

(Sample 17C)

Figure 14A:
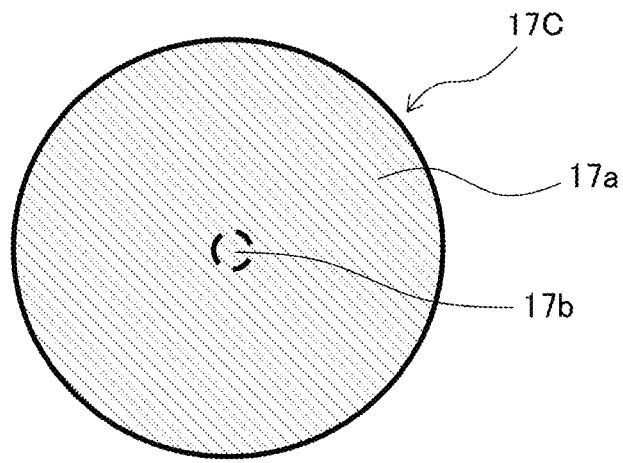
FIG. 14A is a top view of sample 17C showing still another example of the shape of the sample targeted for stress analysis according to the present invention.
Figure 14B:
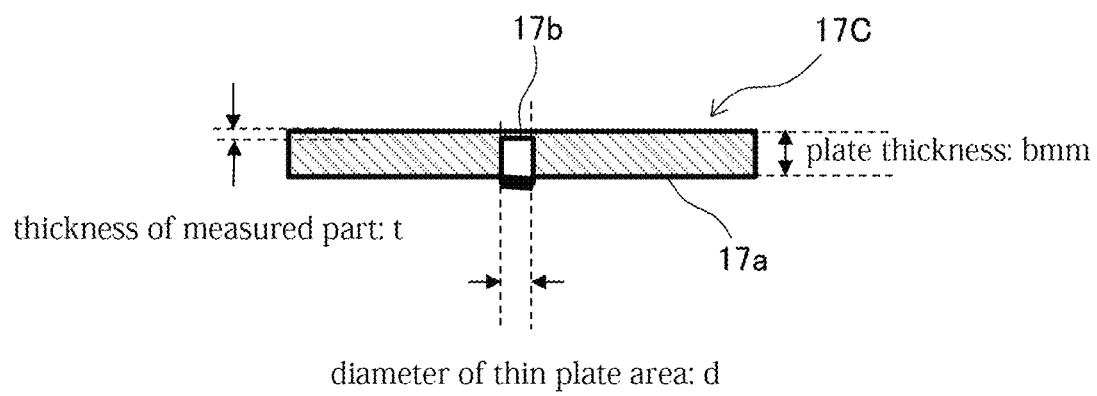
FIG. 14B is a cross-sectional view of sample 17C.
Figure 14C:
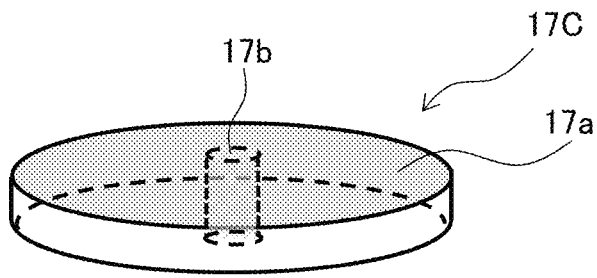
FIG. 14C is an oblique perspective view of sample 17C.

FIG. 14A to FIG. 14C are configuration diagrams showing still another shape of the sample 17C of a structure where the tensile stress only is applied to the top and bottom surfaces at the center of the sample, where FIG. 14A is a top view, FIG. 14B is a cross-sectional view, and FIG. 14C is an oblique perspective view.

At the center of a disk-shaped metal plate having plate thickness b of 0.5 mm, a hole having diameter d of 1.6 mm and thickness of 0.4 mm was fabricated in a concentric fashion. By leaving a thin plate part having thickness t of 0.1 mm, sample 17C having a diaphragm part 17b in a thin plate part at the inner center of the thick circular part 17a, was fabricated. The diameter of the diaphragm part 17b of this sample 17C is made to be smaller than that of sample 17B as shown in FIG. 12A to FIG. 12C.

Figure 15A:
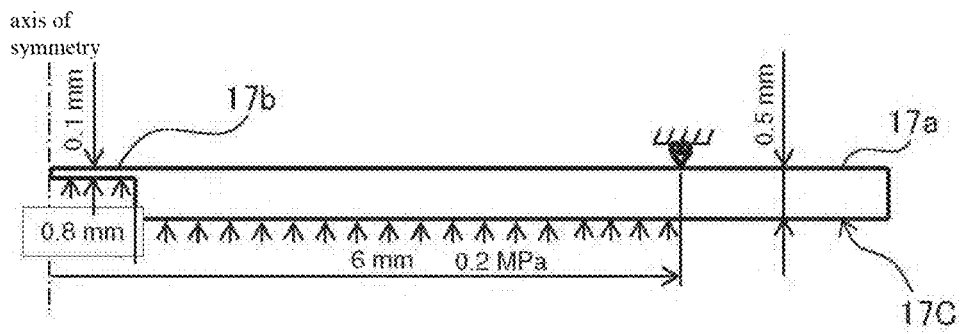
FIG. 15A is an example of the shape and actual dimensions for stress calculation of sample 17C.
Figure 15B:
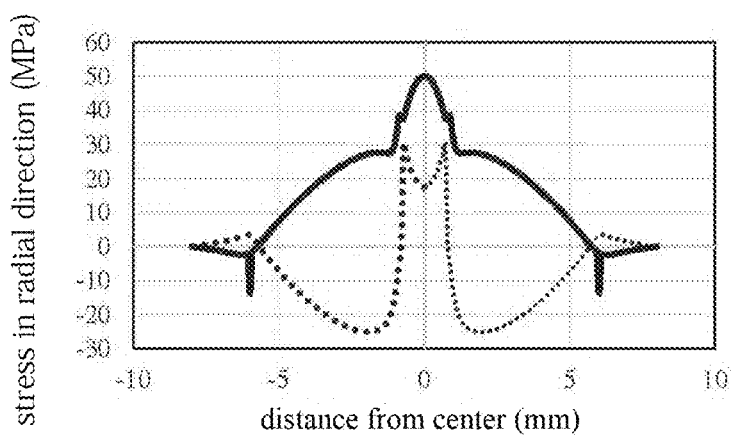
FIG. 15B is a chart showing the result of stress calculation of sample 17C.
Figure 15C:
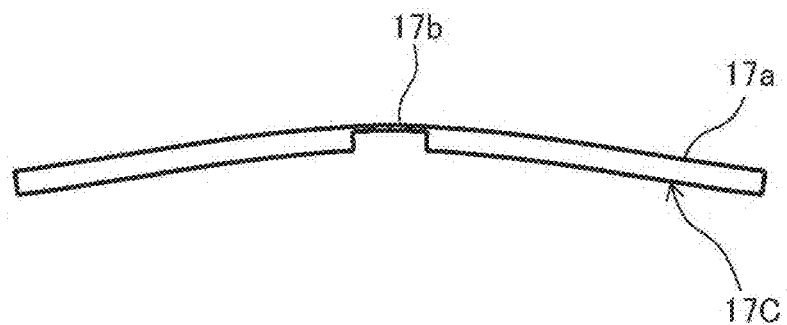
FIG. 15C is a schematic view of the distortion of sample 17C reflecting the result of calculation shown in FIG. 15B.

FIG. 15A to FIG. 15C explain the result of stress analysis of the shape of the sample 17C as shown in FIG. 14A to FIG. 14C performed by using the finite element method (FEM) when P is 0.2 MPa, where FIG. 15A shows boundary conditions of the finite element method analysis using a two-dimensional axial symmetry model, FIG. 15B shows the stress distribution in the radial direction on the top and bottom surfaces of the sample obtained by the analysis, and FIG. 15C shows a deformation diagram with 100 deformation magnification obtained by the analysis. At the diaphragm part 17b of sample 17C, the tensile stress is applied to both top and bottom surfaces of the sample 17C, although the magnitude of stress applied differs on the top and bottom surfaces of the sample 17C.

(Sample 17D)

Sample 17D was fabricated as the same manner as sample 17C as shown in FIG. 14A to FIG. 14C except that the diameter of the hole (concave) fabricated at the center of the disk-shaped metal plate was made to be as small as 0.4 mm. The sample having a diaphragm part 17b in a thin plate part at the inner center of the thick circular part 17a was thus fabricated.

Figure 16A:
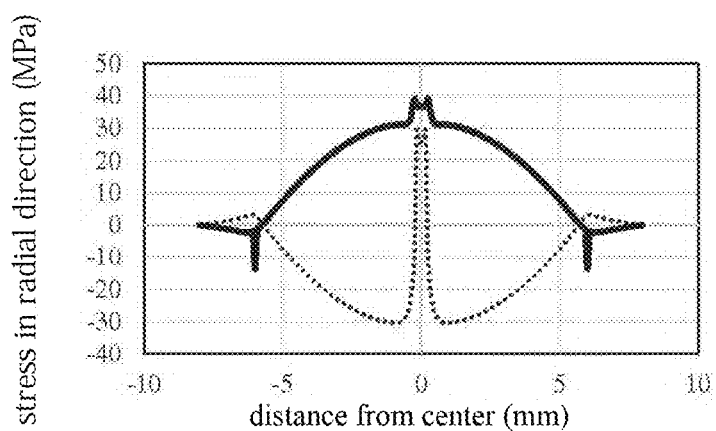
FIG. 16A is a chart showing the result of stress calculation of sample 17D showing yet another example of the shape of the sample targeted for stress analysis.
Figure 16B:
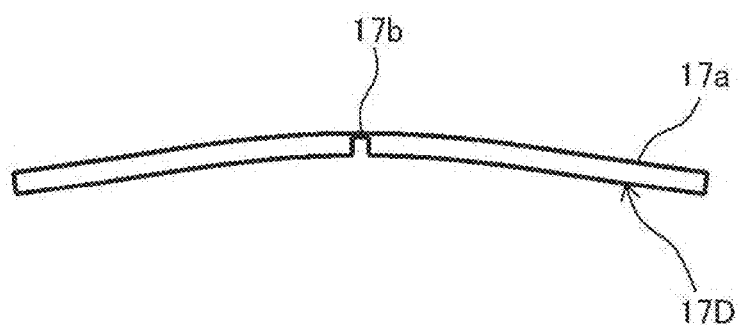
FIG. 16B is a schematic view showing the distortion of sample 17D reflecting the calculation result in FIG. 16A.

FIG. 16A and FIG. 16B explain the result of stress analysis performed by using the finite element method (FEM) when P is 0.2 MPa, where FIG. 16A shows the stress distribution in the radial direction on the top and the bottom surfaces of the sample obtained by the FEM analysis using a two-dimensional axial symmetry model, and FIG. 16B is a deformation diagram with 100 deformation magnification obtained by the analysis. At the diaphragm part 17b of sample 17D, the tensile stress is applied to both top and bottom surfaces of the sample, although the intensity of the stress applied differs on the top and bottom surfaces. By making the diameter of the diaphragm part 17b smaller than that of sample 17C, the difference in stress between the top and bottom surfaces of the sample was made smaller, with tensile stress being applied to both.

(Sample 17E)

Figure 17A:
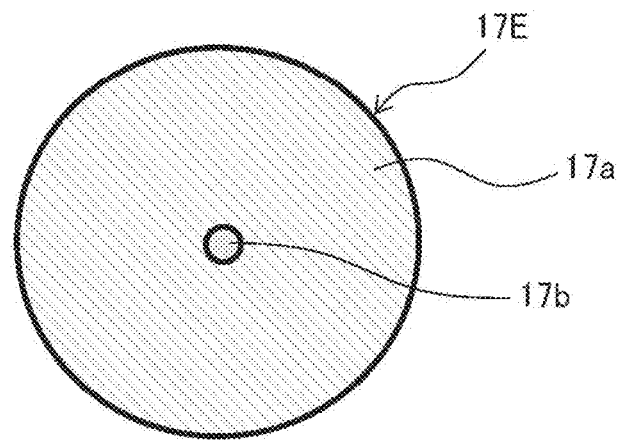
FIG. 17A is a top view of sample 17E showing another example of the shape of the sample targeted for stress analysis according to the present invention.
Figure 17B:
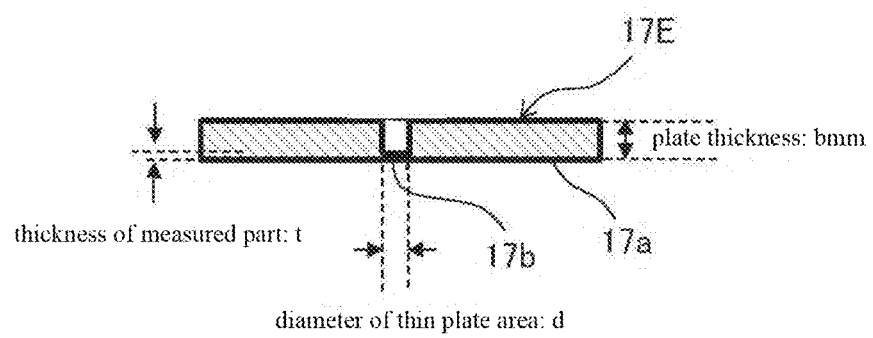
FIG. 17B is a cross-sectional view of sample 17E.
Figure 17C:
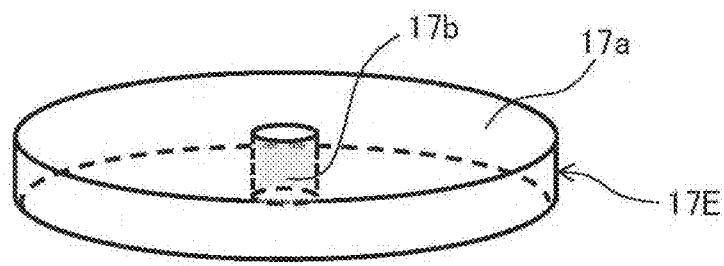
FIG. 17C is an oblique perspective view of sample 17E.

FIG. 17A to FIG. 17C are configuration diagrams showing sample 17E of a structure where the compression stress only is applied on the top and bottom surfaces at the center of the sample, where FIG. 17A is a top view, FIG. 17B is a cross-sectional view, and FIG. 17C is an oblique perspective view.

At the center of a disk-shaped metal plate having a plate thickness b of 0.5 mm, a hole having diameter d of 1.6 mm and thickness of 0.4 mm was fabricated from the top surface of the sample in a concentric fashion. By leaving a thin plate part having thickness t of 0.1 mm, the sample 17E having a diaphragm part 17b in a thin plate part at the inner center of the thick circular part 17a was fabricated.

Figure 18A:
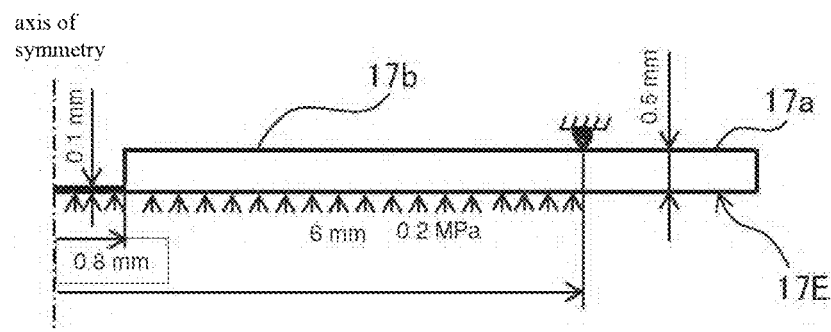
FIG. 18A is an example of the shape and actual dimensions for stress calculation of sample 17E.
Figure 18B:
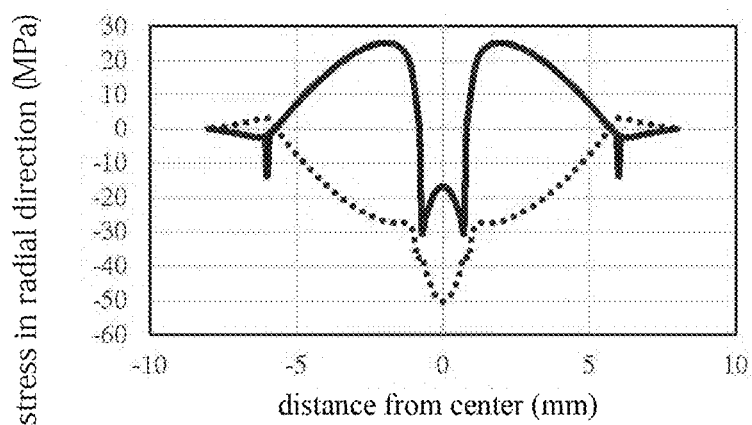
FIG. 18B is a chart showing the result of stress calculation of sample 17E.
Figure 18C:
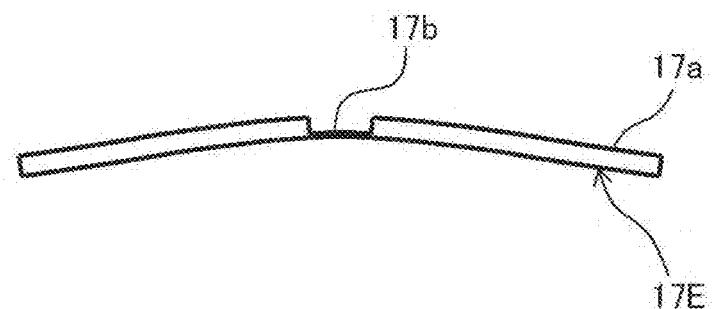
FIG. 18C is a schematic view showing the distortion of sample 17E reflecting the calculation result in FIG. 18B.

FIG. 18A to FIG. 18C explain the result of stress analysis of the shape of the sample 17E as shown in FIG. 17A to FIG. 17C performed by using the finite element method (FEM) when P is 0.2 MPa, where FIG. 18A shows boundary conditions of the finite element method analysis using a two-dimensional axial symmetry model, FIG. 18B shows the stress distribution in the radial direction on the top and bottom surfaces of the sample obtained by the analysis, and FIG. 18C shows a deformation diagram with 100 deformation magnification obtained by the analysis. At the diaphragm part 17b of the sample 17E, compression stress is applied both to top and bottom surfaces of the sample, although the intensity of the stress differs between the top and the bottom surfaces of the sample.

Samples 17 suitable for stress to be applied due to the differential pressure are not limited to the typical samples 17A to 17E mentioned above but various modifications can be made as required. In the above examples, the circular part 17a having a circular shape was described for example as the thick peripheral part, but various circular shapes such as polygonal or deformed shapes are allowed. Also, since the peripheral part need not be continuous in the circular pattern, the semicircular shape or the U shape are also allowed. By making the peripheral part to be in a shape different from the circular part 17a, the state of concentration of stress is made to differ from that of the circular shape, and it is thus possible to obtain knowledge on each shape, in addition to that of the circular shape. With the sample as shown in 17A to 17D, the circular diaphragm part 17b was disposed on the topmost surface on the side of the analysis chamber 11, and with sample 17E, the circular diaphragm part 17b was disposed on the topmost surface on the side of the hydrogen pipe 14. However, the diaphragm part 17b may be in other shapes such as polygons, and a desired stress may be generated by selecting the size of the diaphragm part 17b and the position in the thickness direction of the peripheral part as required.

Embodiment 2

A point-defect location detecting device and a point-defect location detecting method according to the present invention will then be described. The point-defect location detecting device shares the major part with the above mentioned hydrogen permeation and diffusion path observation device. Also, the point-defect location detecting method shares the major part with the above mentioned method of measuring observation target ions passing through the sample.

Figure 19:
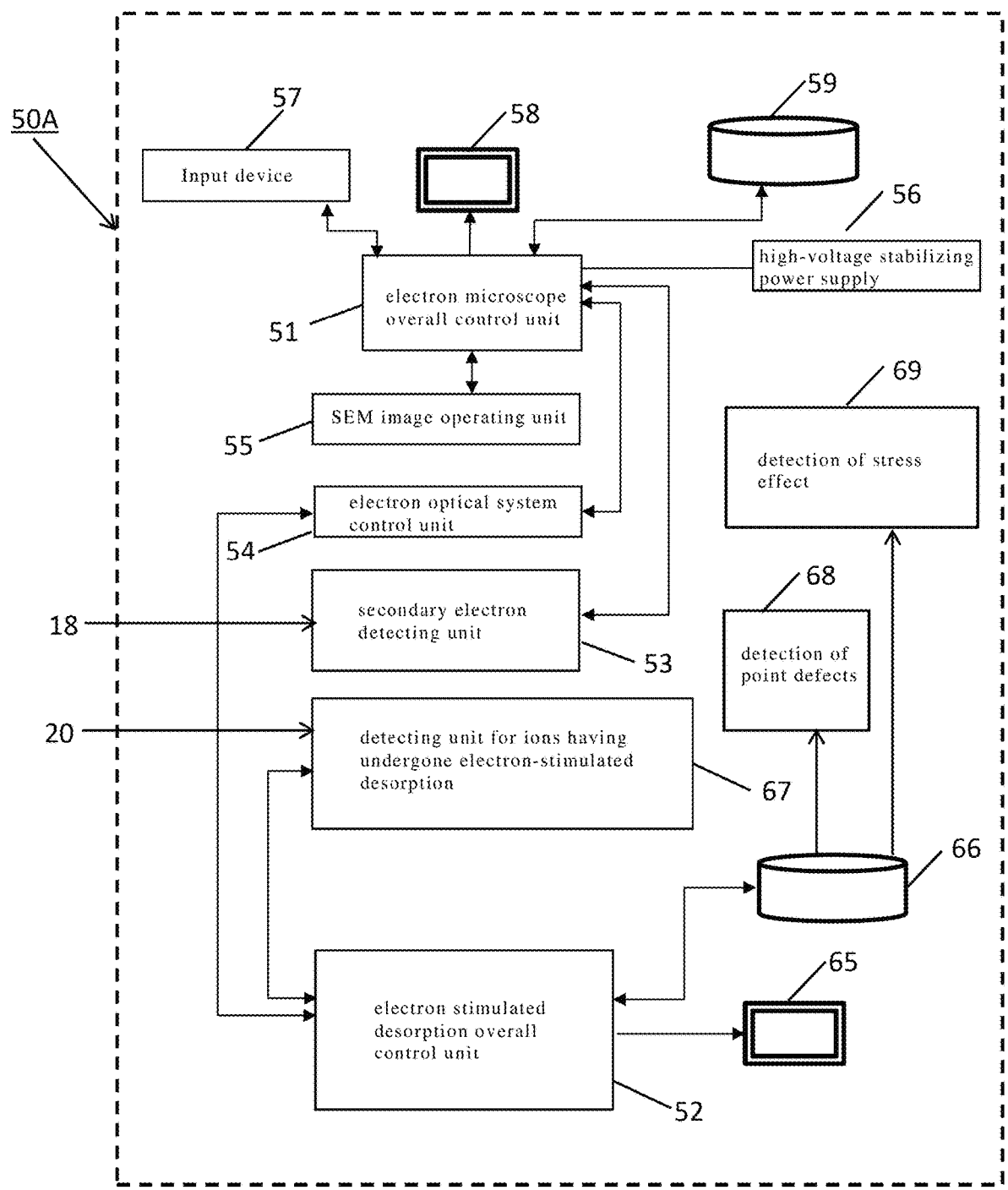
FIG. 19 is a block diagram showing the structure of the control unit of the point-defect location detecting unit according to the present invention capable of extracting the effect of stress application as well as point-defect locations.

FIG. 19 is a functional block diagram of the control unit 50A of the point-defect location detecting device according to the present invention. The components that have the same function as those shown in FIG. 5 are given the same signs and their explanation will be omitted.

As shown in FIG. 19, the control unit 50A includes an electron microscope overall control unit 51 for controlling the scanning electron microscope 15, and an electron stimulated desorption overall control. unit 52 for controlling the acquisition of an ESD image. In this embodiment, a point-defect location detecting unit 68 for detecting the location of point defects is provided. With the point-defect location detecting unit 68, by comparing the SEM image stored in the memory unit 59 by the electron microscope overall control unit 51 with the ESD image stored in the memory unit 66 by the electron stimulated desorption overall control unit 52 with the resolution of 50 nm or lower and analyzing them, the location of point defects can be detected. In other words, since the position resolution of the point defect, which is a hydrogen release position, depends on the magnification of the scanning electron microscope 15 in principle, the position resolution of the ESD image can be improved to approximately the same as the magnification of the scanning electron microscope 15. The position resolution of 50 nm or lower can be obtained, for example. Thus, by comparing the SEM image of the sample 17 stored in the memory unit 59 with the ESD image of the sample 17 stored in the memory unit 66 by the same position resolution, the information on the point defects on the surface of the sample can be obtained from the SEM image, and structural information concerning the release points of observation target ions can be obtained from the ESD image. Furthermore, as described later, based on the structural information concerning the release points of observation target ions obtained from the ESD image and the information on point defects obtained from the SEM image, the location of point defects of the sample can be identified. In this embodiment, a stress effect detecting unit 69 is provided to extract the effect obtained when stress is applied to the sample by using differential pressure as in the case of Embodiment 1. The stress effect detecting unit 69 analyzes the image stored in the memory unit 66 to use the effect of stress for the detection of point defects.

The operation of the point-defect location detecting device configured as mentioned above will hereinafter be described.

Step 11: A sample having a point defect is prepared. As samples having a point defect, those having a surface whose surface structure has been modified, to which a barrier film is applied, on which a multi-layer film is deposited, etc. are available.

Step 12: The sample having the point defect prepared in step 11 is placed in a temperature-variable diaphragm-type sample holder 12. The sample can be placed on the sample mounting part 12b by using a sample fixing plate 13. By performing observation target gas supply process for supplying observation gas and pressurized gas supply process for supplying pressurized gas to the hack side of the sample mounted to the diaphragm-type sample holder 12 simultaneously, or sequentially, a desired stress is generated to the sample and observation target gas is supplied to the sample, as in the case of Embodiment 1.

Step 13: As an image acquisition process, a SEM image of the sample is obtained.

Step 14: The surface of the sample is analyzed as required. For the surface analysis of the sample, an Auger electron spectroscopy analyzer can be used.

Step 15: The gas is introduced from the back surface of the sample as required, and the mass analysis is performed using a mass analyzer 35.

Step 16: As the image acquisition process, an ESD image of the sample is then obtained. The ESD image can be obtained by following the same steps 1 to 6 as in Embodiment 1.

Step 17: The SEM image and the ESD image of the sample are compared. At this time, the position resolution can be made to be 50 nm or lower. Thus, the point defects of the sample can be identified.

The method of fabricating a sample having a point defect in step 11 will be described below. The purpose of fabricating the sample having the point defect is to verify the effect of the point-defect location detecting method. In actual investigation of samples, it is unnecessary to intentionally fabricate a point defect.

First, to form a surface modified layer by modifying the surface structure of the base material of the sample, a chemical etching and a method of causing physical excitation of the sample are available. To cause the base material of the sample to react to obtain another material, the surface structure on the top and/or bottom surface of the sample may be modified by oxidation or nitriding to form a surface oxidized layer or a surface nitrided layer. It is also possible to form a surface modified layer made of a material different from the sample on the base material of the sample.

The purposes of surface modification are roughly classified into two. One of the purposes is not to allow adsorption of gas molecules from the gas atmosphere with which the modified surface layer contacts. The other purpose is not to allow permeation of the origin of gas molecules (hydrogen atoms, for example) from the base material existing inside the modified surface layer.

Consequently, when the surface modified layer of the sample is made of a material that does not allow permeation of gas molecules intended for blocking, or atoms of the component of the gas molecules such as hydrogen atoms, the locations, where the surface modified layer is not formed, become point defects. Hydrogen atoms, etc., the origin of the gas molecules, penetrate from the surface modified layer to the analysis chamber through point defects, and are obtained as an ESD image.

Secondly, when the surface modified layer is also formed by various deposition methods, the locations, where the surface modified layer is not formed, become point defects. As a barrier layer, a metal layer, a polymer layer, etc. as the barrier against hydrogen diffusion, steam diffusion, and helium penetration are available. Furthermore, as the barrier layer, a surface modified by a dense ceramic layer or an oxidized layer intended to inhibit adsorption of oxygen, nitrogen, and carbon system gas molecules may be used.

The present invention is not limited to the embodiments described above, but various modifications are allowed within the scope of the claims of the present invention. Needless to say, those modifications are included in the scope of the present invention. For example, the shape of sample 17 is not limited to a round shape, and a square or a polygonal plate may be used as a sample.

Embodiment 3

Figure 20:
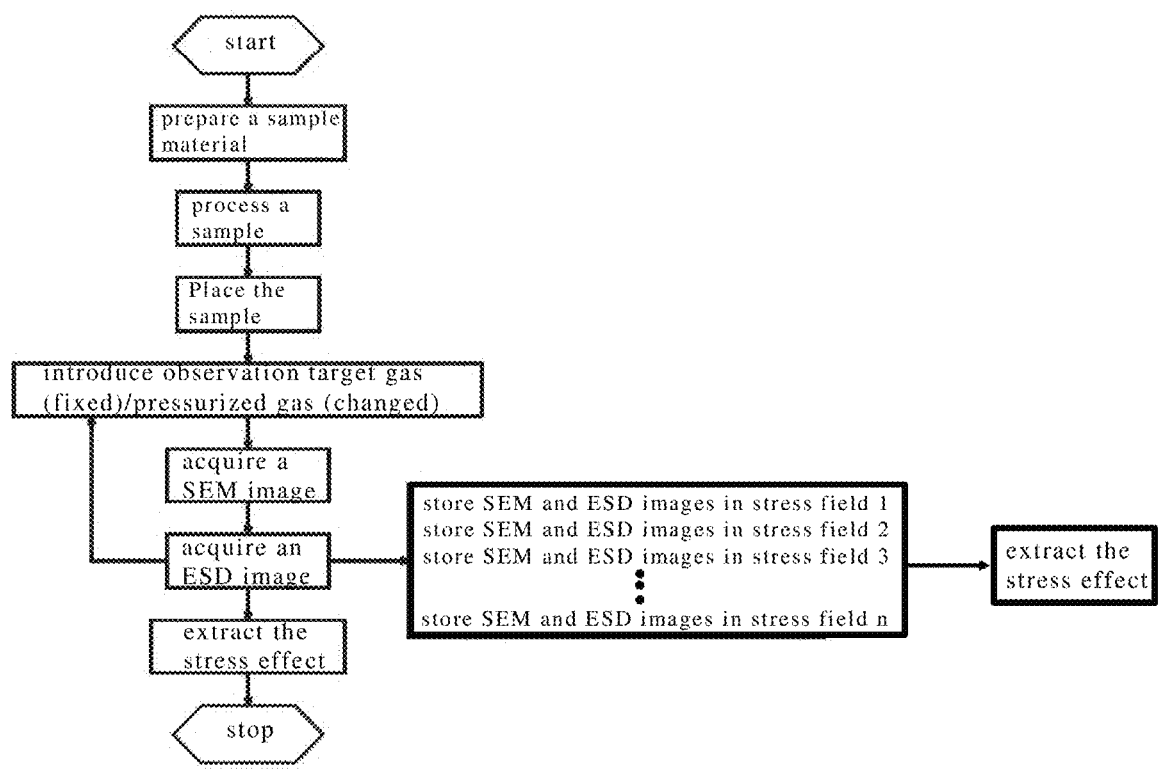
FIG. 20 is a flow chart for extracting the effect of application of stress based on the measurement according to the present invention.
Figure 21:
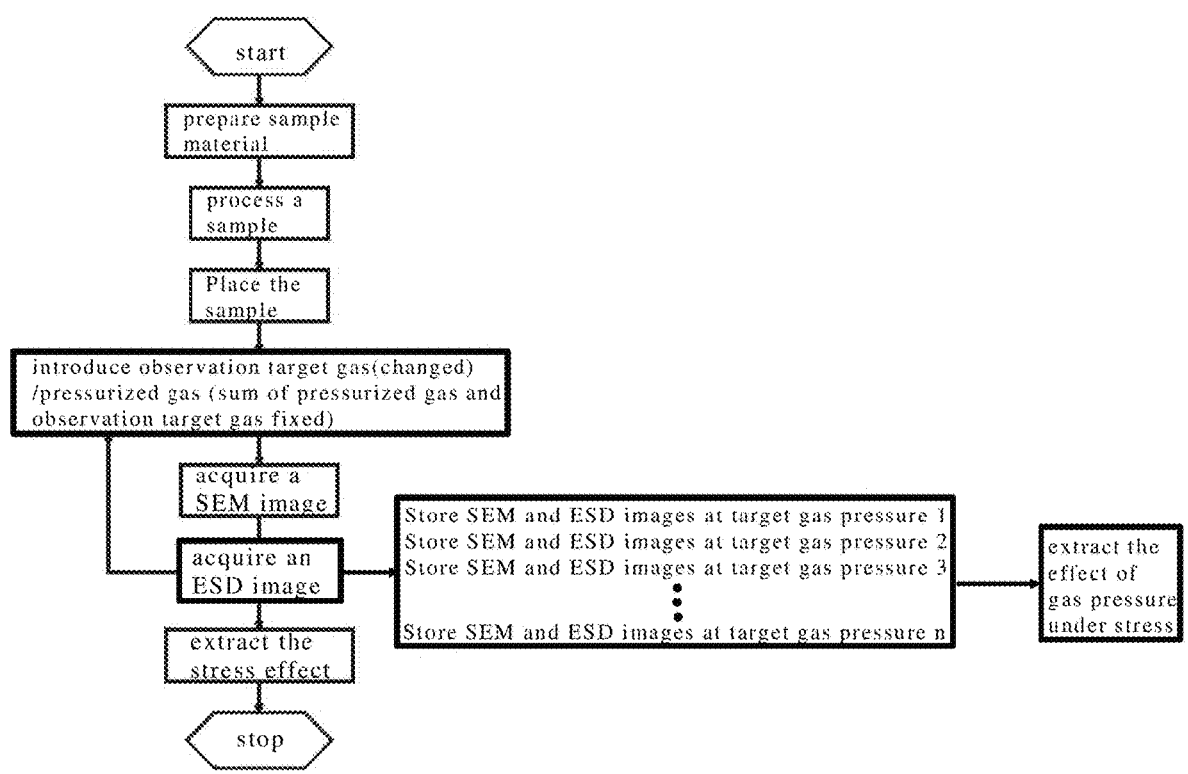
FIG. 21 is a flow chart for extracting dependence on pressure in a stress field based on the measurement according to the present invention.

Examples of measuring various behaviors of diffusion and penetration of gases using a device for observing permeation and diffusion path of target gas having the same major part as that of Embodiment 1 will be described. FIG. 20 and FIG. 21 are functional flow charts of the device for observing permeation and diffusion path of observation target gas according to the present invention. By sequentially programming the observation target gas partial pressure, the pressurized gas pressure, and the chronological repetitive measurement according to the measurement purposes, various behaviors of gas diffusion and permeation can be measured.

FIG. 20 is a flow chart for extracting the effect of stress application from the measurement according to the present invention.

After the sample is processed into a shape that allows application of stress, it is mounted to the diaphragm-type sample holder 12 and placed under the scanning electron microscope 15, the observation target gas and the pressurized gas having pressure 1 are introduced to obtain an ESM image as well as an ESD image, which is a permeation image of the observation target gas, and each image is stored. Then, with the gas pressure of the observation target gas fixed, the gas pressure of the pressurized gas is changed to become gas pressure 2, a SEM image is obtained together with an ESD image, which is a permeation image of the observation target gas, and each image is stored. Similarly, while changing the pressurized gas to have gas pressure 3, 4, 5 . . . n, the SEM images and the ESD images of the observation target gas are sequentially obtained and stored. Then, by classifying these ESD images with the pressurized gas regarded as a variable, the permeation characteristics of the observation target gas in the stress field can be extracted.

FIG. 21 is a flow chart for extracting the dependency of measurement of the present invention on pressure in the stress field. After the sample is processed into a shape that allows application of stress, it is mounted to the diaphragm-type sample holder 12 and placed under the scanning electron microscope 15, the observation target gas and the pressurized gas having pressure 1 are introduced to obtain a SEM image as well as an ESD image, which is a permeation image of the observation target gas, and each image is stored. Then, after the observation target gas pressure is changed to pressure 2, the SEM images as well as ESD images are obtained and stored. If the ratio of the pressure of the observation target gas is not negligible compared to the pressure of the gas for applying stress (1% or higher), it is necessary to decrease the pressure of the gas for applying stress to a level balanced with the pressure of the observation target gas to eliminate the fluctuation of the sum of the pressure of the observation target gas and that of the gas for applying stress. The measurement is repeated, with the pressure of the observation target gas changed to pressure 3, 4, 5, . . . n, and the obtained images are stored. By classifying those ESD images with the observation target gas pressure regarded as a variable, the dependency of the permeation characteristics of the observation target gas on pressure in the stress field can be extracted.

In the above observation target gas and the pressurized gas supply processes, by changing the pressure of the pressurized gas, or the partial pressure of the observation target gas, or both, the differential. pressure can be changed. In other words, by changing the pressure of the observation target gas and/or pressurized gas, the differential pressure can be changed. By repeating the image acquisition process every time the differential pressure is changed, and obtaining SEM images and ESD images, the behavior of discharge of the observation target gas can be measured according to the change in the differential pressure.

By performing the measurement similar to the one as shown in FIG. 20 for a surface layer of a sample processed in a shape that allows application of stress, the generation of point defects in a stress field can be examined, and also the stress characteristics of the sample against the observation target gas released through point defects on the surface layer can be extracted. Also, by performing measurement while changing the temperature of the sample 17, and thus calculating the data on the amount of release of hydrogen ions, the diffusion speed of the hydrogen within the sample 17 and/or the diffusion coefficient can be calculated together with the time and the two-dimensional location information of the sample.

INDUSTRIAL APPLICABILITY

According to the device for observing permeation and diffusion path of the observation target gas of the present invention, since the stress can be applied to the sample to be observed under the operando hydrogen microscope, it can be used preferably for selection of structural materials for hydrogen storage facilities, nuclear reactor containment, and medical and research facilities where high energy lines such as neutron rays and electron beams are used.

According to the method of measuring observation target gas of the present invention, since a mechanism of degradation phenomena such as embrittlement of structural material due to observation target gas containing hydrogen can be studied, it can provide design guidelines for non-destructive inspection and hydrogen storage facilities, nuclear reactor containment, and medical and research facilities using high energy lines such as neutron rays and electron beams.

According to the point-defect, location detecting device and the method of detecting point-defect location using the device, gases adsorbed within a sample and those passing through point defects of the sample can be detected, and so they can efficiently provide design guidelines for non-destructive inspection and hydrogen storage facilities, nuclear reactor containment, and medical and research facilities using high energy lines such as neutron rays and electron beams.

REFERENCE SIGNS LIST

10: Hydrogen permeation and diffusion path observation device
11: Analysis chamber
11a: Conducting wire draw-out port
12: Diaphragm-type sample holder
12a: Sample side of diaphragm-type sample bolder
12b: Flange side of diaphragm-type sample holder
13: Sample fixing plate
14: Hydrogen pipe (observation target gas pipe)
15: Scanning electron microscope
16: Electron source
16a: Electron beam
16b: First deflection coil
16c: Second deflection coil
17, 17A, 17B, 17C, 17E: Sample
17a: Circular part (peripheral part)
17b: Diaphragm part
18: Secondary electron detector
19: Hydrogen gas supply unit (target gas supply unit)
20: Hydrogen ion detecting unit
21: Collecting mechanism
21a: Mounting part
21b: Mesh part.
21c: Mesh retaining part.
22: Ion energy decomposing unit
23: Ion detector
24: Pressurized gas supply unit (noble gas supply unit)
31: Sample rack
32: Sample heater
33: Sample temperature measuring unit
34: Sample position adjusting unit
35: Mass analyzer
36: Auger electron spectroscopy analyzer
37: First evacuation unit
38: Second evacuation unit
41: Hydrogen ion (observation target ion)
50, 50A: Control unit
51: Electron microscope overall control unit
52: Electron stimulated desorption overall control unit
53: Secondary electron detecting unit
54: Electron optical system control unit
55: SEM image operating unit
56: High voltage stabilizing power supply
57: Input device
58: Display
59: Memory unit
60: Two-dimensional multi-channel scaler
61: Pulse counter
61a: Hydrogen ion count signal
62: Synchronization control unit
62a: Vertical scanning signal
62b: Horizontal scanning signal
62c: Information on scanning position
62d, 62e: Digital-analog converter
63: Unit for sorting measured signals to two-dimensional plane
64: ESD image operating unit
65: Display
66: Memory unit
67: Detecting unit for ions having undergone electron stimulated desorption
68: Point-defect location detecting unit
69: Stress effect detecting unit
72: Microprocessor
72a, 72b: Input/output interface
W: Open window (mounting area)

What is claimed is:

1. A device for observing permeation and diffusion path of target gas, comprising:
   a scanning electron microscope having: an analysis chamber housing a sample; an electron source emitting an electron beam to the sample; and a secondary electron detector detecting secondary electrons generated by the electron beam emitted to the sample;
   an ion detector detecting ions generated by the electron beam emitted from the electron source to the sample;
   a pipe connected to a back side of the sample, the pipe being supplied with a gas;
   a diaphragm-type sample holder, to which the sample is mounted, as a diaphragm dividing between the analysis chamber and the pipe; and
   a control unit including a first memory and a first processor coupled to the first memory, the first processor being configured to:
   obtain a SEM image based on secondary electrons generated from the sample by electron beam scanning;
   control turning the gas, which diffuses within the sample from the back side and is discharged to a surface of the sample, into the ions by electron stimulated desorption by the electron beam, in a state where stress is applied to the sample due to differential pressure generated between the analysis chamber and the pipe by supplying the gas to the pipe; and
   obtain an ESD image of the ions detected by the ion detector in synchronization with the electron beam scanning.

2. The device for observing permeation and diffusion path of target gas as set forth in claim 1, wherein a pressurized gas is supplied to the pipe to generate the differential pressure.

3. The device for observing permeation and diffusion path of target gas as set forth in claim 1, wherein
   the ion detector comprises: a collecting mechanism collecting the ions generated from the surface of the sample; an ion energy decomposing unit, which is disposed on the top of the collecting mechanism, accepting the ions collected by the collecting mechanism and removing components other than the ions; and an ion detector detecting the ions that have passed the ion energy decomposing unit and outputting them into the control unit, and
   the collecting mechanism is a lens fastened to the periphery of the sample, and is structured so that by applying a given voltage between the lens and the ground, the ions are collected and made to enter the ion detector.

4. The device for observing permeation and diffusion path of observation target gas as set forth in claim 1, wherein
   the diaphragm-type sample holder comprises a sample mounting part having an open window, and
   the sample is mounted to the sample mounting part so as to block the open window.

5. The device for observing permeation and diffusion path of target gas as set forth in claim 4, wherein the sample is fastened to the diaphragm-type sample holder.

6. The device for observing permeation and diffusion path of observation target gas as set forth in claim 1, wherein the observation target gas is any one of hydrogen, deuterium, helium, oxygen, nitrogen and, water, or any one of molecules, atoms, and ions of gases related to the purpose of manufacturing or use of the sample, or any one of molecules, atoms, or ions derived from a plurality of such gases.

7. The device for observing permeation and diffusion path of observation target gas as set forth in claim 1, wherein the pressurized gas is at least one pressurized gas selected from a group of helium (He), neon (Ne), argon (Ar), krypton (Kr), xenon (Xe), radon (Rn), and nitrogen (N).

8. A sample for observation to be mounted to the permeation and diffusion path observation device as set forth in claim 1, comprising:
    a thin diaphragm part where stress is generated due to differential pressure at the time of observation; and
    a thick peripheral part formed around the diaphragm part, wherein the sample is mounted to the diaphragm-type sample holder as a diaphragm dividing between the analysis chamber and the pipe.

9. The sample for observation as set forth in claim 8, wherein the sample is a flat metal plate, a plate material made by thinning the welded part of a metal, a plate material made by thinning a metal having corroded part, a ceramic plate, a polymeric plate, or a plate material made of a composite material of those.

10. The sample for observation as set forth in claim 8, wherein the diaphragm is formed in a circular or polygonal shape, and the size, thickness, and the position of the diaphragm in the thickness direction of the peripheral part are set so that the tensile stress or the compression stress is applied to the surface on the side of the analysis chamber or to the surface on the side of the pipe due to the differential pressure generated at the time of observation.

11. A point-defect location detecting device, comprising:
    the device for observing permeation and diffusion path of target gas as set forth in claim 1;
    a second memory; and
    a second processor coupled to the second memory, the second processor being configured to detect a location of point defects of the sample based on the SEM image and the ESD image of the sample.

12. A method of measuring gas permeating a sample, the method comprising:
    supplying a gas to a pipe connected to a back side of a sample housed in an analysis chamber, so as to apply a stress to the sample due to differential pressure generated between the analysis chamber and the gas pipe;
    obtaining a SEM image by using secondary electrons generated from the sample upon which an electron beam is scanned;
    turning the gas, which diffuses within the sample from the back surface of the sample and is discharged to a surface of the sample, into ions by an electron stimulated desorption of the electron beam; and
    obtaining an ESD image of the ions in synchronization with the electron beam scanning, wherein
    in the obtaining of the ESD image, a position resolution of the SEM image and that of the ESD image are made to be 50 nm or lower for comparison to obtain structural information concerning a position of release of the ions.

13. The method of measuring observation target gas as set forth in claim 12, wherein the supplying of the gas further comprises:
    supplying a pressurized gas to the pipe to generate the differential pressure between the analysis chamber and the pipe.

14. The method of measuring gas as set forth in claim 13, wherein
    the differential pressure is generated by changing a pressure of the pressurized gas, or a partial pressure of the gas, or both, in the supplying of the gas,
    the obtaining of the SEM image and the obtaining of the ESD image are repeated by sequentially changing the differential pressure, and
    a behavior of discharge of the gas with respect to the change in differential pressure is measured each time based on the obtained SEM image and ESD image.

15. A method of detecting the location of a point defect, the method comprising:
    preparing a sample;
    placing the sample in the diaphragm-type sample holder provided in an analysis chamber, the diaphragm-type sample holder comprising a diaphragm dividing the analysis chamber and a pipe connected to a back side of the sample;
    supplying a gas to the pipe, so as to apply a stress to the sample due to differential pressure generated between the analysis chamber and the gas pipe;
    obtaining the SEM image of the sample by using secondary electrons generated from the sample upon which an electron beam is scanned;
    turning the gas, which diffuses within the sample from the back surface of the sample and is discharged to a surface of the sample, into ions by an electron stimulated desorption of the electron beam;
    obtaining an ESD image of the ions in synchronization with the electron beam scanning; and
    identifying the location of the point defect of the sample by comparing the SEM image and the ESD image.

* * * * *